US010886700B2

United States Patent
Enya et al.

(10) Patent No.: US 10,886,700 B2
(45) Date of Patent: Jan. 5, 2021

(54) OPTICAL MODULE CONTROL METHOD, OPTICAL MODULE UNIT, AND OPTICAL MODULE

(71) Applicant: SUMITOMO ELECTRIC INSDUSTRIES, LTD., Osaka (JP)

(72) Inventors: Yohei Enya, Itami (JP); Hiromi Nakanishi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/467,786

(22) PCT Filed: Sep. 4, 2017

(86) PCT No.: PCT/JP2017/031830
§ 371 (c)(1),
(2) Date: Jun. 7, 2019

(87) PCT Pub. No.: WO2018/105182
PCT Pub. Date: Jun. 14, 2018

(65) Prior Publication Data
US 2019/0334315 A1 Oct. 31, 2019

(30) Foreign Application Priority Data
Dec. 8, 2016 (JP) .................................. 2016-238695

(51) Int. Cl.
*H01S 5/068* (2006.01)
*H01S 5/022* (2006.01)
(Continued)

(52) U.S. Cl.
CPC ...... *H01S 5/06804* (2013.01); *H01S 5/02212* (2013.01); *H01S 5/02407* (2013.01);
(Continued)

(58) Field of Classification Search
CPC ............. H01S 5/06804; H01S 5/02212; H01S 5/02407; H01S 5/02415; H01S 5/0683; H01S 5/4093
See application file for complete search history.

(56) References Cited

U.S. PATENT DOCUMENTS

| 2004/0240800 A1* | 12/2004 | Uchida ................ G02B 6/4266 385/92 |
| 2008/0031289 A1* | 2/2008 | Cho ........................ H01S 5/141 372/22 |
| 2014/0079083 A1* | 3/2014 | Mizuseki ............ H01S 5/02415 372/34 |

FOREIGN PATENT DOCUMENTS

| JP | 2003-198040 A | 7/2003 |
| JP | 2006-202992 A | 8/2006 |

(Continued)

*Primary Examiner* — Armando Rodriguez
(74) *Attorney, Agent, or Firm* — Baker Botts L.L.P.; Michael A. Sartori

(57) ABSTRACT

An optical module control method is a method for controlling an optical module that includes a semiconductor light emitting element and an electronic cooling module configured to adjust a temperature of the semiconductor light emitting element. The optical module control method includes a step of detecting a temperature of a light emitting unit including the semiconductor light emitting element, and outputting temperature information of the semiconductor light emitting element; a step of detecting an environmental temperature and outputting temperature information of the environmental temperature, the environmental temperature being a temperature of environment where the light emitting unit is placed; and a step of controlling an output of the electronic cooling module on the basis of the temperature information of the semiconductor light emitting element and the temperature information of the environmental temperature, and adjusting the temperature of the light emitting unit.

8 Claims, 14 Drawing Sheets

(51) Int. Cl.
*H01S 5/024* (2006.01)
*H01S 5/0683* (2006.01)
*H01S 5/40* (2006.01)

(52) U.S. Cl.
CPC ........ *H01S 5/02415* (2013.01); *H01S 5/0683* (2013.01); *H01S 5/4093* (2013.01)

(56) References Cited

FOREIGN PATENT DOCUMENTS

| | | |
|---|---|---|
| JP | 2007-17925 A | 1/2007 |
| JP | 2007-65600 A | 3/2007 |
| JP | 2007-328895 A | 12/2007 |
| JP | 2009-93101 A | 4/2009 |
| JP | 2014-78690 A | 5/2014 |

* cited by examiner

US 10,886,700 B2

OPTICAL MODULE CONTROL METHOD, OPTICAL MODULE UNIT, AND OPTICAL MODULE

TECHNICAL FIELD

The present invention relates to an optical module control method, an optical module unit, and an optical module.

The present application claims the benefit of Japanese Patent Application No. 2016-238695, filed Dec. 8, 2016, which is hereby incorporated by reference herein in its entirety.

BACKGROUND ART

Optical modules are known in which a semiconductor light emitting element is disposed in a package (see, e.g., Patent Literatures 1 to 4).

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

An optical module control method according to the present invention is a method for controlling an optical module that includes a semiconductor light emitting element and an electronic cooling module configured to adjust a temperature of the semiconductor light emitting element. The optical module control method includes a step of detecting a temperature of a light emitting unit including the semiconductor light emitting element, and outputting temperature information of the semiconductor light emitting element; a step of detecting an environmental temperature and outputting temperature information of the environmental temperature, the environmental temperature being a temperature of environment where the light emitting unit is placed; and a step of controlling an output of the electronic cooling module on the basis of the temperature information of the semiconductor light emitting element and the temperature information of the environmental temperature, and adjusting the temperature of the light emitting unit. In the step of adjusting the temperature of the light emitting unit, if the environmental temperature is in a first environmental temperature range, the temperature of the light emitting unit is adjusted such that a temperature range of the semiconductor light emitting element is a first semiconductor light emitting element temperature range, and if the environmental temperature is in a second environmental temperature range higher than the first environmental temperature range, the temperature of the light emitting unit is adjusted such that the temperature range of the semiconductor light emitting element is a second semiconductor light emitting element temperature range higher than the first semiconductor light emitting element temperature range.

An optical module unit according to the present invention includes an optical module including a light emitting unit and an electronic cooling module, the light emitting unit including a base member and a semiconductor light emitting element mounted on the base member, the light emitting unit being configured to form light, the electronic cooling module being configured to adjust a temperature of the semiconductor light emitting element; a first processing unit configured to detect a temperature of the light emitting unit including the semiconductor light emitting element, and process temperature information of the semiconductor light emitting element in such a manner that the temperature information is output; a second processing unit configured to detect an environmental temperature which is a temperature of environment where the light emitting unit is placed, and process temperature information of the environmental temperature in such a manner that the temperature information is output; and a third processing unit configured to control an output of the electronic cooling module on the basis of the temperature information of the semiconductor light emitting element processed by the first processing unit in such a manner as to be output and the temperature information of the environmental temperature processed by the second processing unit in such a manner as to be output, and adjust the temperature of the light emitting unit. If the environmental temperature is in a first environmental temperature range, the third processing unit adjusts the temperature of the light emitting unit such that a temperature range of the semiconductor light emitting element is a first semiconductor light emitting element temperature range, and if the environmental temperature is in a second environmental temperature range higher than the first environmental temperature range, the third processing unit adjusts the temperature of the light emitting unit such that the temperature range of the semiconductor light emitting element is a second semiconductor light emitting element temperature range higher than the first semiconductor light emitting element temperature range.

An optical module according to the present invention includes a light emitting unit including a base member and a semiconductor light emitting element mounted on the base member, the light emitting unit being configured to form light; a protective member having an exit window that allows light from the light emitting unit to pass therethrough, the protective member being configured to surround the light emitting unit; an electronic cooling module configured to adjust a temperature of the semiconductor light emitting element; a light emitting unit temperature detector configured to detect a temperature of the light emitting unit including the semiconductor light emitting element; and an environmental temperature detector configured to detect a temperature of environment where the light emitting unit is placed.

DESCRIPTION OF EMBODIMENTS

Figure 1:
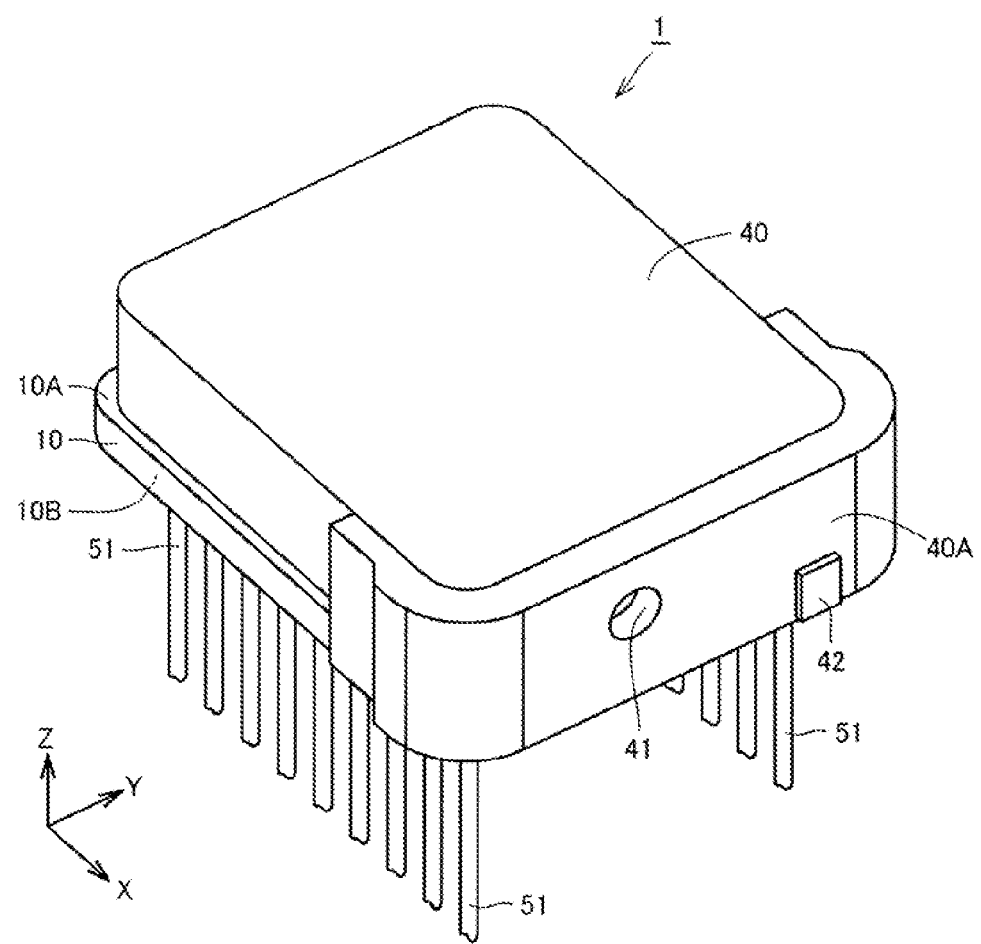
FIG. 1 is a schematic perspective view illustrating a structure of an optical module.

Problems to be Solved by the Present Disclosure

The optical module described above may be used in an environment with a wide range of low to high temperatures. To achieve optical output with high accuracy even in an environment with a wide temperature range, it is necessary to adjust the temperature of the optical module.

It is desirable that power consumption of the optical module during operation be as small as possible. Also, there are demands for size reduction of the entire system that adjusts the temperature of the optical module.

Accordingly, an object of the present invention is to provide an optical module control method that can reduce power consumption while reducing system size.

Another object of the present invention is to provide an optical module unit that can reduce power consumption while reducing system size.

Another object of the present invention is to provide an optical module that can properly reduce system size and power consumption.

Advantageous Effects of the Present Disclosure

The optical module control method described above can reduce power consumption while reducing system size.

The optical module unit described above can reduce power consumption while reducing system size.

The optical module described above can properly reduce system size and power consumption.

Description of Embodiments of the Invention of the Present Application

First, embodiments of the invention of the present application will be summarized. An optical module control method according to the invention of the present application is a method for controlling an optical module that includes a semiconductor light emitting element and an electronic cooling module configured to adjust a temperature of the semiconductor light emitting element. The optical module control method includes a step of detecting a temperature of a light emitting unit including the semiconductor light emitting element, and outputting temperature information of the semiconductor light emitting element; a step of detecting an environmental temperature and outputting temperature information of the environmental temperature, the environmental temperature being a temperature of environment where the light emitting unit is placed; and a step of controlling an output of the electronic cooling module on the basis of the temperature information of the semiconductor light emitting element and the temperature information of the environmental temperature, and adjusting the temperature of the light emitting unit. In the step of adjusting the temperature of the light emitting unit, if the environmental temperature is in a first environmental temperature range, the temperature of the light emitting unit is adjusted such that a temperature range of the semiconductor light emitting element is a first semiconductor light emitting element temperature range, and if the environmental temperature is in a second environmental temperature range higher than the first environmental temperature range, the temperature of the light emitting unit is adjusted such that the temperature range of the semiconductor light emitting element is a second semiconductor light emitting element temperature range higher than the first semiconductor light emitting element temperature range.

As described above, if the environmental temperature is in the second environmental temperature range higher than the first environmental temperature range, the temperature of the light emitting unit is adjusted such that the temperature range of the semiconductor light emitting element is the second semiconductor light emitting element temperature range higher than the first semiconductor light emitting element temperature range. This can reduce a temperature difference between the light emitting unit whose temperature is to be adjusted by the electronic cooling module and the environmental temperature. This makes it possible to reduce power consumption of the electronic cooling module during temperature adjustment. That is, when the environmental temperature is relatively high, the temperature of the light emitting unit is adjusted, with the temperature range of the semiconductor light emitting element set to a relatively high temperature range, so as to reduce a temperature difference between the environmental temperature and the light emitting unit during temperature adjustment. This makes it possible to reduce power consumption of the electronic cooling module during temperature adjustment. When the temperature range of the semiconductor light emitting element is set higher, a larger amount of power needs to be supplied to the semiconductor light emitting element to obtain the same optical output. However, as compared to the increase in the amount of power supplied to the semiconductor light emitting element, the reduction of power consumption of the electronic cooling module achieved by reducing the temperature difference between the environmental temperature and the light emitting unit is larger. A reduction in overall power consumption is thus achieved.

During operation of the electronic cooling module, the electronic cooling module itself generates heat. To facilitate dissipation of the generated heat of the electronic cooling module and adjust the temperature of the light emitting unit while maintaining efficient operation of the electronic cooling module, the optical module is provided with a heat dissipating system including a heat sink, a fan that blows air to the heat sink, and a heat pipe that efficiently removes heat accumulated in the heat sink. The cooling capability of the heat sink basically depends on its size. Specifically, a larger-sized heat sink basically has higher capability of cooling an object to be cooled. As described above, the optical module control method according to the invention of the present application can reduce power consumption of the electronic cooling module. In this case, reducing the size of the heat sink included in the heat dissipating system can reduce the size of the entire heat dissipating system including the optical module. Also, as for the fan provided for cooling the heat sink, reducing the operating time of the fan can reduce power consumption. Depending on the operating temperature range of the optical module to be used, cooling by the fan may not be required, and it may even be possible to remove the fan itself. A further size reduction is achievable in this case. Also, since power consumption of the electronic cooling module can be reduced, the heat pipe provided for the heat sink in the heat dissipating system can be removed to achieve a further size reduction.

The semiconductor light emitting element controlled by the optical module control method described above may be a semiconductor laser. This configuration, in which the optical module uses laser light of the semiconductor laser, enables reduction of power consumption while reducing the system size.

The semiconductor laser described above may be a laser that emits red light or a laser that emits infrared light. The optical output of a laser that emits red light or a laser that emits infrared light is highly dependent on temperature. Therefore, the optical module control method of the present application is suitable for use in controlling the optical module in which the semiconductor laser is a laser that emits red light or a laser that emits infrared light. The red light may be light with a wavelength ranging from about 620 nanometers (nm) to about 750 nm.

An output of the semiconductor light emitting element may be regulated by controlling current supplied to the semiconductor light emitting element in accordance with the temperature range of the semiconductor light emitting element adjusted in the step of adjusting the temperature of the light emitting unit. With this configuration, the optical output of the semiconductor light emitting element can be made constant by controlling the current.

The first semiconductor light emitting element temperature range and the second semiconductor light emitting element temperature range may each be within ±3° C. of a central value. This configuration can reduce the effect of temperature variation on the optical output of the semiconductor light emitting element.

An optical module unit according to the invention of the present application includes an optical module including a light emitting unit and an electronic cooling module, the light emitting unit including a base member and a semiconductor light emitting element mounted on the base member, the light emitting unit being configured to form light, the electronic cooling module being configured to adjust a temperature of the semiconductor light emitting element; a first processing unit configured to detect a temperature of the light emitting unit including the semiconductor light emitting element, and process temperature information of the semiconductor light emitting element in such a manner that the temperature information is output; a second processing unit configured to detect an environmental temperature which is a temperature of environment where the light emitting unit is placed, and process temperature information of the environmental temperature in such a manner that the temperature information is output; and a third processing unit configured to control an output of the electronic cooling module on the basis of the temperature information of the semiconductor light emitting element processed by the first processing unit in such a manner as to be output and the temperature information of the environmental temperature processed by the second processing unit in such a manner as to be output, and adjust the temperature of the light emitting unit. If the environmental temperature is in a first environmental temperature range, the third processing unit adjusts the temperature of the light emitting unit such that a temperature range of the semiconductor light emitting element is a first semiconductor light emitting element temperature range, and if the environmental temperature is in a second environmental temperature range higher than the first environmental temperature range, the third processing unit adjusts the temperature of the light emitting unit such that the temperature range of the semiconductor light emitting element is a second semiconductor light emitting element temperature range higher than the first semiconductor light emitting element temperature range.

In the optical module unit described above, the first processing unit processes temperature information of the semiconductor light emitting element in such a manner that the temperature information is output. Also, the second processing unit processes temperature information of the environment temperature of the light emitting unit in such a manner that the temperature information is output. The third processing unit controls an output of the electronic cooling module on the basis of the temperature information of the semiconductor light emitting element processed by the first processing unit in such a manner as to be output and the temperature information of the environmental temperature processed by the second processing unit in such a manner as to be output, and adjusts the temperature of the light emitting unit. The third processing unit controls an output of the electronic cooling module and if the environmental temperature is in a first environmental temperature range, the third processing unit adjusts the temperature of the light emitting unit such that a temperature range of the semiconductor light emitting element is a first semiconductor light emitting element temperature range, whereas if the environmental temperature is in a second environmental temperature range higher than the first environmental temperature range, the third processing unit adjusts the temperature of the light emitting unit such that the temperature range of the semiconductor light emitting element is a second semiconductor light emitting element temperature range higher than the first semiconductor light emitting element temperature range. This can reduce a temperature difference between the environmental temperature and the light emitting unit during temperature adjustment, and reduce power consumption of the electronic cooling module during temperature adjustment. When the temperature range of the semiconductor light emitting element is set higher, a larger amount of power needs to be supplied to the semiconductor light emitting element to obtain the same optical output. However, as compared to the increase in the amount of power supplied to the semiconductor light emitting element, the reduction of power consumption of the electronic cooling module achieved by reducing the temperature difference between the environmental temperature and the light emitting unit is larger. A reduction in overall power consumption is thus achieved.

In the optical module unit described above, the optical module may further include a protective member configured to surround the light emitting unit, and an environmental temperature detector attached to an outer periphery of the protective member and configured to detect the environmental temperature which is a temperature of environment where the light emitting unit is placed. In the optical module unit with this configuration, when the environmental temperature detector attached to the outer periphery of the protective member is used and the second processing unit processes the temperature information of the environmental temperature in such a manner that the temperature information is output, the temperature of environment where the light forming unit is placed can be more accurately detected, and this enables more proper reduction of power consumption.

An optical module according to the invention of the present application includes a light emitting unit including a base member and a semiconductor light emitting element mounted on the base member, the light emitting unit being configured to form light; a protective member having an exit window that allows light from the light emitting unit to pass therethrough, the protective member being configured to surround the light emitting unit; an electronic cooling module configured to adjust a temperature of the semiconductor light emitting element; a light emitting unit temperature detector configured to detect a temperature of the light emitting unit; and an environmental temperature detector configured to detect a temperature of environment where the light emitting unit is placed.

In the optical module described above, the electronic cooling module can adjust the temperature of the semiconductor light emitting element. Also, the light emitting unit temperature detector can detect the temperature of the light emitting unit. Also, the environmental temperature detector can detect the temperature of the environment where the light emitting unit is placed. By using the detected temperature of the light emitting unit and the detected temperature of the environment where the light emitting unit is placed, the system size reduction and the reduction of power consumption can be properly achieved. Specifically, for example, temperature information of the semiconductor light emitting element is output from the temperature of the light emitting unit detected by the light emitting unit temperature detector, temperature information is output from the environmental temperature of the light emitting unit detected by the environmental temperature detector, and the output of the electronic cooling module is controlled on the basis of the output temperature information of the semiconductor light emitting element and the output temperature information of the environmental temperature. In controlling the output of the electronic cooling module, if the environmental temperature is in a first environmental temperature range, the temperature of the light emitting unit is adjusted such that the temperature range of the semiconductor light emitting element is a first semiconductor light emitting element temperature range, and if the environmental temperature is in a second environmental temperature range higher than the first environmental temperature range, the temperature of the light emitting unit is adjusted such that the temperature range of the semiconductor light emitting element is a second semiconductor light emitting element temperature range higher than the first semiconductor light emitting element temperature range. This makes it possible to properly achieve the reduction of system size and power consumption.

In the optical module, the environmental temperature detector may be attached to an outer periphery of the protective member. The optical module with this configuration can more accurately detect the temperature of environment where the light emitting unit is placed, and can more properly reduce power consumption.

Details of Embodiments of the Invention or the Present Application

Figure 2:
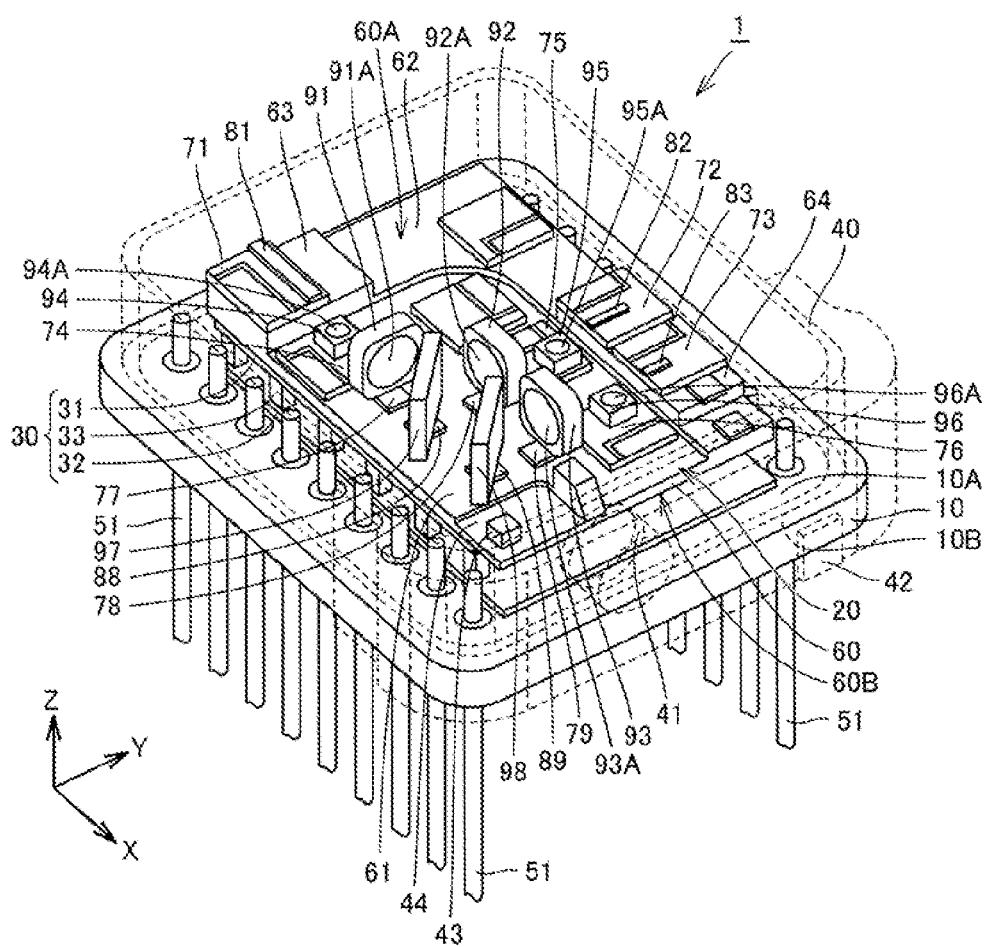
FIG. 2 is another schematic perspective view illustrating the structure of the optical module.

Embodiments of an optical module control method according to the invention of the present application will now be described with reference to FIGS. 1 to 11. FIG. 2 is a view of FIG. 1, with a cap 40 removed. In the drawings to be referred to, the same or corresponding parts will be given the same reference numerals, and their description will not be repeated.

First, a configuration of an optical module 1 will be described. The optical module 1 is controlled by an optical module control method for controlling the optical module 1 according to the present embodiment. Referring to FIGS. 1 and 2, the optical module 1 controlled by the optical module control method according to the present embodiment includes a stem 10 having a flat plate-like shape, a light forming unit 20 disposed on one principal surface 10A of the stem 10 and serving as a light emitting unit that forms light, the cap 40 disposed on the one principal surface 10A of the stem 10 in contact therewith to cover the light forming unit 20, and a plurality of lead pins 51 passing through the stem 10 from the other principal surface 10B to the one principal surface 10A and protruding from both the one principal surface 10A and the other principal surface 10B. The stem 10 and the cap 40 are, for example, welded in an airtight manner. That is, the light forming unit 20 is hermetically sealed by the stem 10 and the cap 40. A moisture-reduced (or moisture-removed) gas, such as dry air, is sealed in the space surrounded by the stem 10 and the cap 40. The cap 40 has an exit window 41 that allows light from the light forming unit 20 to pass therethrough. The exit window 41 may have the shape of a flat plate with principal surfaces parallel to each other, or may have the shape of a lens that focuses or diffuses light from the light forming unit 20. The stem 10 and the cap 40 form a protective member. In plan view (i.e., as viewed in the Z-axis direction), the stem 10 is in the shape of a rectangle with four rounded corners. The cap 40 is also in the shape of a rectangle with four rounded corners in plan view. The stem 10 is configured to have a larger area than the cap 40. When the cap 40 is placed on the stem 10 in contact therewith, the outer edge of the stem 10, except for a side having the exit window 41, protrudes from the outer periphery of the cap 40 in a flange-like manner. For example, the length of short sides of the stem 10 (i.e., length in the Y-axis direction) is selected to be 10 millimeters (mm).

The cap 40 has a resin-molded thermocouple 42 for detecting the temperature of the cap 40. The thermocouple 42 is attached to the surface of the cap 40 having the exit window 41. That is, the thermocouple 42 is attached to an outer periphery 40A of the cap 40. With the thermocouple 42, the ambient temperature of the light forming unit 20 can be detected as an environmental temperature, and output as temperature information of the environmental temperature.

The ambient temperature of the light forming unit 20 is also the ambient temperature of the optical module 1. In the present embodiment, the thermocouple 42 is an environmental temperature detector that detects the temperature of environment where the light forming unit 20 is placed.

Figure 3:
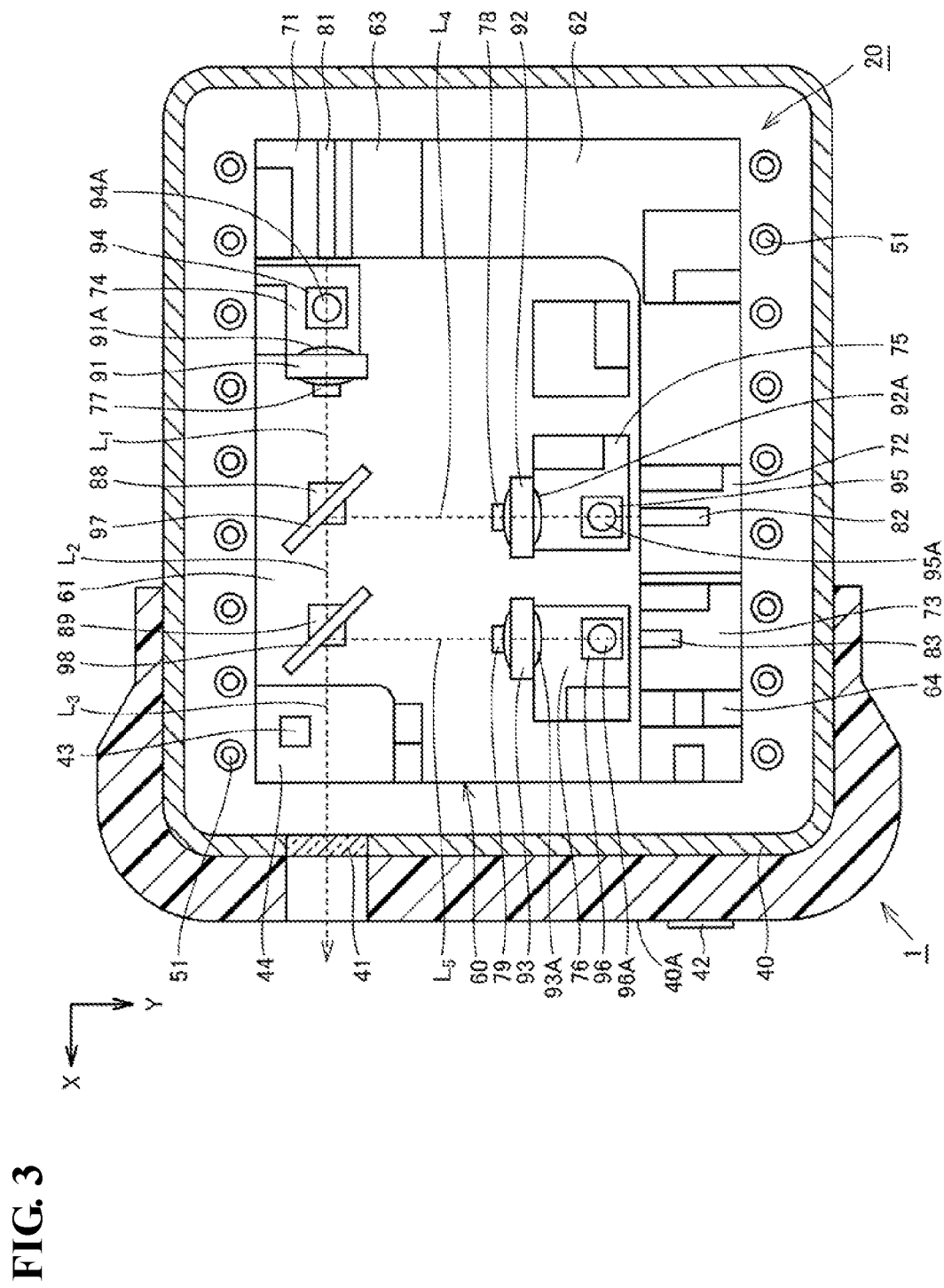
FIG. 3 is a schematic plan view illustrating the structure of the optical module.

Referring to FIGS. 2 and 3, the light forming unit 20 includes a base plate 60 having a plate-like shape and serving as a base member. The base plate 60 has one principal surface 60A rectangular in plan view. The base plate 60 includes a base region 61, a chip mount region 62, and a thermistor mount region 44. The chip mount region 62 is formed in a region including one short side (first short side) of the one principal surface 60A and one long side (first long side) connected to the first short side. The chip mount region 62 has a greater thickness than the base region 61. The chip mount region 62 thus has a greater height than the base region 61. A first chip mount region 63 having a greater thickness (or greater height) than its adjacent regions is formed in a region opposite a side of the chip mount region 62 where the first short side is connected to the first long side. A second chip mount region 64 having a greater thickness (or greater height) than its adjacent regions is formed in a region opposite a side of the chip mount region 62 where the first long side is connected to the first short side.

A flat plate-like first submount 71 is disposed on the first chip mount region 63. A red laser diode 81 that emits red light is disposed on the first submount 71. The red laser diode 81 is a semiconductor laser serving as a first semiconductor light emitting element. A second submount 72 and a third submount 73 having a flat plate-like shape are disposed on the second chip mount region 64. The third submount 73 is disposed opposite the connection portion of the first long side and the first short side, as viewed from the second submount 72. A green laser diode 82 that emits green light is disposed on the second submount 72. The green laser diode 82 is a semiconductor laser serving as a second semiconductor light emitting element. A blue laser diode 83 that emits blue light is disposed on the third submount 73. The blue laser diode 83 is a semiconductor laser serving as a third semiconductor light emitting element. The heights of the optical axes of the red laser diode 81, the green laser diode 82, and the blue laser diode 83 (i.e., the distances between the one principal surface 60A of the base plate 60 (reference surface) and the optical axes, or the distances with respect to the reference surface in the Z-axis direction) are adjusted to the same level by the first submount 71, the second submount 72, and the third submount 73. The red light is light with a wavelength ranging from about 620 nanometers (nm) to about 750 nm, the green light is light with a wavelength ranging from about 495 nm to about 570 nm, and the blue light is light with a wavelength ranging from about 420 nm to about 495 nm.

The thermistor mount region 44 is formed in a region including an intersection of the other short side (second short side) of the one principal surface 60A of the base plate 60 near the exit window 41 and a long side of the one principal surface 60A connected to the second short side. The thermistor mount region 44 has a smaller thickness than the base region 61. The thermistor mount region 44 thus has a lower height than the base region 61. A thermistor 43 is disposed on the thermistor mount region 44. The thermistor 43 detects the temperature of the light forming unit 20 including the red laser diode 81, the green laser diode 82, and the blue laser diode 83, and outputs temperature information of the light forming unit 20. In the present embodiment, the thermistor 43 is a light emitting unit temperature detector that detects the temperature of the light forming unit 20.

A fourth submount 74, a fifth submount 75, and a sixth submount 76 are disposed on the base region 61 of the base plate 60. A first photodiode 94 serving as a first light receiving element, a second photodiode 95 serving as a second light receiving element, and a third photodiode 96 serving as a third light receiving element are disposed on the fourth submount 74, the fifth submount 75, and the sixth submount 76, respectively. The fourth submount 74, the fifth submount 75, and the sixth submount 76 adjust the heights of the first photodiode 94, the second photodiode 95, and the third photodiode 96 (i.e., the distances to the optical axes of the red laser diode 81, the green laser diode 82, and the blue laser diode 83, or the distances in the Z-axis direction). The first photodiode 94, the second photodiode 95, and the third photodiode 96 are positioned to directly receive light from the red laser diode 81, the green laser diode 82, and the blue laser diode 83, respectively. This configuration enables accurate detection of light intensity and highly accurate adjustment of the light intensity. In the present embodiment, all the semiconductor light emitting elements are provided with the respective light receiving elements. The first photodiode 94, the second photodiode 95, and the third photodiode 96 are capable of receiving red light, green light, and blue light, respectively. The first photodiode 94 is disposed between the red laser diode 81 and a first lens 91 in the light emitting direction of the red laser diode 81. The second photodiode 95 is disposed between the green laser diode 82 and a second lens 92 in the light emitting direction of the green laser diode 82. The third photodiode 96 is disposed between the blue laser diode 83 and a third lens 93 in the light emitting direction of the blue laser diode 83.

A first lens holder 77, a second lens holder 78, and a third lens holder 79, which are raised portions, are formed on the base region 61 of the base plate 60. The first lens 91, the second lens 92, and the third lens 93 are disposed on the first lens holder 77, the second lens holder 78, and the third lens holder 79, respectively. The first lens 91, the second lens 92, and the third lens 93 have lens portions 91A, 92A, and 93A, respectively, whose surfaces are lens surfaces. The lens portions 91A, 92A, and 93A are integrally formed with the respective other regions of the first lens 91, the second lens 92, and the third lens 93. The central axes of the lens portions 91A, 92A, and 93A of the first lens 91, the second lens 92, and the third lens 93, that is, the optical axes of the lens portions 91A, 92A, and 93A are adjusted by the first lens holder 77, the second lens holder 78, and the third lens holder 79 so as to be aligned with the respective optical axes of the red laser diode 81, the green laser diode 82, and the blue laser diode 83. The first lens 91, the second lens 92, and the third lens 93 each convert the spot size of light emitted from a corresponding one of the red laser diode 81, the green laser diode 82, and the blue laser diode 83. By the first lens 91, the second lens 92, and the third lens 93, the spot sizes of light beams emitted from the red laser diode 81, the green laser diode 82, and the blue laser diode 83 are converted to the same spot size.

A first filter 97 and a second filter 98 are disposed on the base region 61 of the base plate 60. The first filter 97 and the second filter 98 both have the shape of a flat plate with principal surfaces parallel to each other. The first filter 97 and the second filter 98 are, for example, wavelength-selective filters. The first filter 97 and the second filter 98 are dielectric multilayer filters. More specifically, the first filter 97 transmits red light and reflects green light. The second filter 98 transmits red light and green light, and reflects blue light. The first filter 97 and the second filter 98 thus selectively transmit and reflect light of a specific wavelength. The first filter 97 and the second filter 98 thus combine light beams emitted from the red laser diode 81, the green laser diode 82, and the blue laser diode 83. The first filter 97 and the second filter 98 are disposed on a first raised region 88 and a second raised region 89, respectively, which are raised portions formed on the base region 61.

Referring to FIG. 3, the red laser diode 81, a light receiving portion 94A of the first photodiode 94, the lens portion 91A of the first lens 91, the first filter 97, and the second filter 98 are arranged in a straight line along the light emitting direction of the red laser diode 81 (i.e., arranged in the X-axis direction). The green laser diode 82, a light receiving portion 95A of the second photodiode 95, the lens portion 92A of the second lens 92, and the first filter 97 are arranged in a straight line along the light emitting direction of the green laser diode 82 (i.e., arranged in the Y-axis direction). The blue laser diode 83, a light receiving portion 96A of the third photodiode 96, the lens portion 93A of the third lens 93, and the second filter 98 are arranged in a straight line along the light emitting direction of the blue laser diode 83 (i.e., arranged in the Y-axis direction). That is, the light emitting direction of the red laser diode 81 intersects the light emitting directions of the green laser diode 82 and the blue laser diode 83. More specifically, the light emitting direction of the red laser diode 81 is orthogonal to the light emitting directions of the green laser diode 82 and the blue laser diode 83. The light emitting direction of the green laser diode 82 is a direction along the light emitting direction of the blue laser diode 83. More specifically, the light emitting direction of the green laser diode 82 is parallel to the light emitting direction of the blue laser diode 83. The principal surfaces of the first filter 97 and the second filter 98 tilt with respect to the light emitting direction of the red laser diode 81. More specifically, the principal surfaces of the first filter 97 and the second filter 98 tilt 45° from the light emitting direction of the red laser diode 81 (i.e., from the X-axis direction).

Next, the operation of the optical module 1 controlled by the method for controlling the optical module 1 according to the present embodiment will be described. Referring to FIG. 3, red light emitted from the red laser diode 81 travels along an optical path $L_1$. While travelling, part of the red light directly enters the light receiving portion 94A of the first photodiode 94. This enables the intensity of the red light emitted from the red laser diode 81 to be detected and then adjusted on the basis of the difference between the detected light intensity and a target intensity of light to be emitted. After passing over the first photodiode 94, the red light enters the lens portion 91A of the first lens 91, where the spot size of the light is converted. Specifically, for example, red light emitted from the red laser diode 81 is converted to collimated light. After the spot size conversion in the first lens 91, the red light travels along the optical path $L_1$ and enters the first filter 97. Since the first filter 97 transmits red light, the light emitted from the red laser diode 81 further travels along an optical path $L_2$ and enters the second filter 98. Since the second filter 98 transmits red light, the light emitted from the red laser diode 81 travels further along an optical path $L_3$, passes through the exit window 41 of the cap 40, and exits the optical module 1.

Green light emitted from the green laser diode 82 travels along an optical path $L_4$. While travelling, part of the green light directly enters the light receiving portion 95A of the second photodiode 95. This enables the intensity of the green light emitted from the green laser diode 82 to be detected and then adjusted on the basis of the difference between the detected light intensity and a target intensity of light to be emitted. After passing over the second photodiode 95, the green light enters the lens portion 92A of the second lens 92, where the spot size of the light is converted. Specifically, for example, the green light emitted from the green laser diode 82 is converted to collimated light. After the spot size conversion in the second lens 92, the green light travels along the optical path $L_4$ and enters the first filter 97. Since the first filter 97 reflects green light, the light emitted from the green laser diode 82 joins the optical path $L_2$. The green light thus combines with the red light, travels along the optical path $L_2$, and enters the second filter 98. Since the second filter 98 transmits green light, the light emitted from the green laser diode 82 further travels along the optical path $L_3$, passes through the exit window 41 of the cap 40, and exits the optical module 1.

Blue light emitted from the blue laser diode 83 travels along an optical path $L_5$. While travelling, part of the blue light directly enters the light receiving portion 96A of the third photodiode 96. This enables the intensity of the blue light emitted from the blue laser diode 83 to be detected and then adjusted on the basis of the difference between the detected light intensity and a target intensity of light to be emitted. After passing over the third photodiode 96, the blue light enters the lens portion 93A of the third lens 93, where the spot size of the light is converted. Specifically, for example, the blue light emitted from the blue laser diode 83 is converted to collimated light. After the spot size conversion in the third lens 93, the blue light travels along the optical path $L_5$ and enters the second filter 98. Since the second filter 98 reflects blue light, the light emitted from the blue laser diode 83 joins the optical path $L_3$. The blue light thus combines with the red light and the green light, travels along the optical path $L_3$, passes through the exit window 41 of the cap 40, and exits the optical module 1.

The optical module 1 includes an electronic cooling module (which may hereinafter be referred to as a thermoelectric cooler or TEC) 30. Specifically, the optical module 1 includes the TEC 30 disposed between the base plate 60 included in the light forming unit 20 and the stem 10. The TEC 30 is a so-called thermoelectric cooler, and includes a heat absorbing plate 31, a heat dissipating plate 32, and a plurality of semiconductor columns 33 spaced apart and disposed between the heat absorbing plate 31 and the heat dissipating plate 32, with an electrode interposed between each of the heat absorbing plate 31 and the heat dissipating plate 32 and the semiconductor columns 33. The heat absorbing plate 31 and the heat dissipating plate 32 are made of, for example, alumina. The heat absorbing plate 31 is disposed in contact with the other principal surface 60B of the base plate 60. The heat dissipating plate 32 is disposed in contact with the one principal surface 10A of the stem 10. The TEC 30 is a Peltier module (Peltier element). By supplying current to the TEC 30 to allow the current to flow therethrough, heat of the base plate 60 in contact with the heat absorbing plate 31 is transferred to the stem 10, so that the base plate 60 is cooled. This reduces temperature rise in the red laser diode 81, the green laser diode 82, and the blue laser diode 83. If, for example, the optical module 1 is placed in an environment of very low temperature, such as minus 40 degrees Celsius (−40° C.), and heating the optical module 1 is better in terms of the output efficiency of the red laser diode 81, the green laser diode 82, and the blue laser diode 83, the base plate 60 may be heated by causing current to flow through the TEC 30 in the opposite direction to reverse the transfer of temperature. During operation of the TEC 30, the TEC 30 itself generates heat. To ensure stable operation of the TEC 30, it is necessary to remove heat of the TEC 30 generated during operation of the TEC 30.

Figure 4:
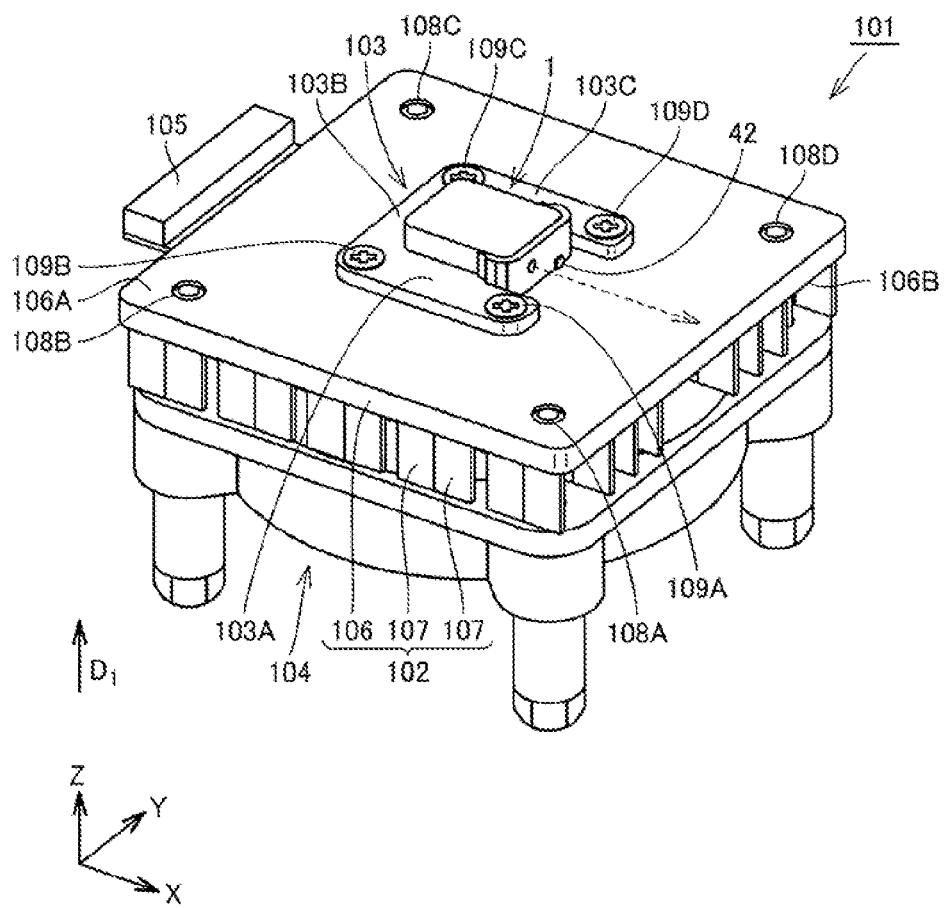
FIG. 4 is a schematic perspective view illustrating a configuration of a heat dissipating system to which the optical module is attached.

A configuration of a heat dissipating system 101 to which the optical module 1 is attached will now be described. Referring also to FIG. 4, the heat dissipating system 101 is provided to dissipate and remove heat generated in the TEC 30 during operation of the TEC 30. The heat dissipating system 101 includes a heat sink 102, a retainer plate 103, a fan 104, and a connector 105. A metal material with good heat transfer properties, such as aluminum, iron, or copper, is selected as a material for the heat sink 102. In FIG. 4, a dashed arrow indicates the light emitting direction of the optical module 1.

The heat sink 102 includes a base member 106 and a plurality of fins 107. The base member 106 is a plate-like member and rectangular in shape as viewed in the thickness direction (or Z-axis direction). More specifically, the base member 106 is square in shape in plan view. In the present embodiment, the base member 106 is about 50 millimeters (mm) on each side.

The optical module 1 is disposed on one principal surface 106A of the base member 106. The base member 106 has, in a central region thereof, as many through-holes (not shown) passing therethrough in the thickness direction as the lead pins 51 at positions which correspond to the respective lead pins 51 when the optical module 1 is placed on the one principal surface 106A of the base member 106. Therefore, when the optical module 1 is placed on the one principal surface 106A of the base member 106, the lead pins 51 are positioned to be inserted into the respective through-holes. The openings of the through-holes are sized to prevent the lead pins 51 from coming into contact with the base member 106 when the lead pins 51 are inserted into the through-holes. In a central region of the one principal surface 106A of the base member 106, four screw holes (not shown) for mounting the retainer plate 103 are provided in a region outside the through-holes for insertion of the lead pins 51. Also, regions at the four corners of the base member 106 are provided with four screw holes 108A, 108B, 108C, and 108D passing through the base member 106 in the thickness direction and used to mount the fan 104.

The fins 107 are disposed on the other principal surface 106B of the base member 106. The fins 107 are thin plate-like members and are arranged at intervals on the other principal surface 106B of the base member 106. The fins 107 are disposed to extend downward from the other principal surface 106B of the base member 106 in the Z-axis direction, that is, in the direction opposite arrow $D_1$. The fins 107 are configured to have the same height or length in the Z-axis direction, from the other principal surface 106B of the base member 106. The heat sink 102, including the base member 106 and the fins 107, is about 10 mm in thickness. The fins 107 increase the overall surface area of the heat sink 102 and improve heat dissipating performance of the heat sink 102. The TEC 30 described above is formed by a Peltier element and has a mechanism that cools the base plate 60 by allowing current to flow through the TEC 30. In contrast, the heat dissipating system 101 has a mechanism in which, by the heat sink 102 made of a material with good heat transfer properties, heat generated in the TEC 30 in contact with the heat sink 102 is transferred to the heat sink 102 and dissipated. That is, the TEC 30 and the heat dissipating system 101 are heat removing systems of different types. The larger the surface area of the base member 106 and the fins 107 of the heat sink 102, the higher the heat dissipation efficiency of the heat dissipating system 101.

The heat sink 102 may have a thermocouple attached thereto for detecting the temperature of the heat sink 102. With this configuration, the temperature of the heat sink 102 can be detected by the attached thermocouple as the environmental temperature of the light forming unit 20, and output as temperature information of the environmental temperature. That is, as an environmental temperature described in detail below, the output temperature information of the heat sink 102 can be used to adjust the temperature of the light forming unit 20. The thermocouple may be attached, for example, at a predetermined position on the one principal surface 106A of the base member 106.

The optical module 1 is attached to the base member 106 such that it is located in the central region of the one principal surface 106A of the base member 106 included in the heat sink 102. The base member 106 has the through-holes at positions that correspond to the lead pins 51 protruding toward the one principal surface 106A of the base member 106 when the optical module 1 is placed on the base member 106. The optical module 1 is attached onto the base member 106 such that the lead pins 51 do not come into contact with the base member 106.

The optical module 1 is attached to the base member 106 by the retainer plate 103. The retainer plate 103 includes a first guide portion 103A, a second guide portion 103B, and a third guide portion 103C. The first guide portion 103A, the second guide portion 103B, and the third guide portion 103C are narrow, thin plate-like members. The retainer plate 103 has a shape in which end portions of the first guide portion 103A and the second guide portion 103B extending in directions orthogonal to each other are continuous, and end portions of the second guide portion 103B and the third guide portion 103C extending in directions orthogonal to each other are also continuous. The retainer plate 103 has four through-holes (not shown) passing therethrough in the thickness direction at positions corresponding to the end portions of the first guide portion 103A, the second guide portion 103B, and the third guide portion 103C. The retainer plate 103 is attached to the heat sink 102 by allowing a total of four screws 109A, 109B, 109C, and 109D to be inserted into the four through-holes and fitted into the four screw holes in the one principal surface 106A of the base member 106.

The optical module 1 is attached to the heat sink 102, with a flange-like protruding region of the stem 10 sandwiched between the retainer plate 103 and the base member 106. The first guide portion 103A is disposed on one side of the cap 40 in a direction orthogonal to the light emitting direction (i.e., on one side in the Y-axis direction). The second guide portion 103B is disposed on a side of the cap 40 opposite the exit window 41. The third guide portion 103C is disposed on the other side of the cap 40 in the direction orthogonal to the light emitting direction (i.e., on the other side in the Y-axis direction). That is, the optical module 1 is positioned by the retainer plate 103 on the one principal surface 106A of the base member 106. Since the thickness of the optical module 1 in the thickness direction is greater than the thickness of the retainer plate 103 in the thickness direction, the optical module 1 protrudes outward of the retainer plate 103 in the Z-axis direction. The optical module 1 is attached in place by applying heat dissipating grease (not shown) between the other principal surface 10B of the stem 10 and the one principal surface 106A of the base member 106. This improves contact between the other principal surface 10B of the stem 10 and the one principal surface 106A of the base member 106, and enables heat generated by the TEC 30 to be efficiently transferred to the heat sink 102.

The fan 104 is disposed adjacent to the other principal surface 106B of the base member 106. More specifically, the fan 104 is attached to the end portions of the fins 107 opposite those adjacent to the other principal surface 106B of the base member 106. By supplying current to the fan 104 to enable the fan 104 to rotate, air is blown toward the fins 107, or more specifically, upward in the Z-axis direction indicated by arrow $D_1$. By actuating the fan 104, air is blown toward the heat sink 102 and the heat sink 102 can be cooled. The current is supplied to the fan 104 in accordance with control. Power is consumed during operation of the fan 104.

The heat sink 102 is provided with the connector 105 that ensures electrical connection between the optical module 1 and an external device. The connector 105 is disposed on a side of the optical module 1 opposite the light emitting direction of the optical module 1. While not shown, the connector 105 is electrically connected to the lead pins 51 of the optical module 1. The connector 105 ensures electrical connection between the optical module 1 and an external device, enables supply of current from the outside to the optical module 1, and enables acquisition of detected temperature information of the light forming unit 20.

Figure 5:
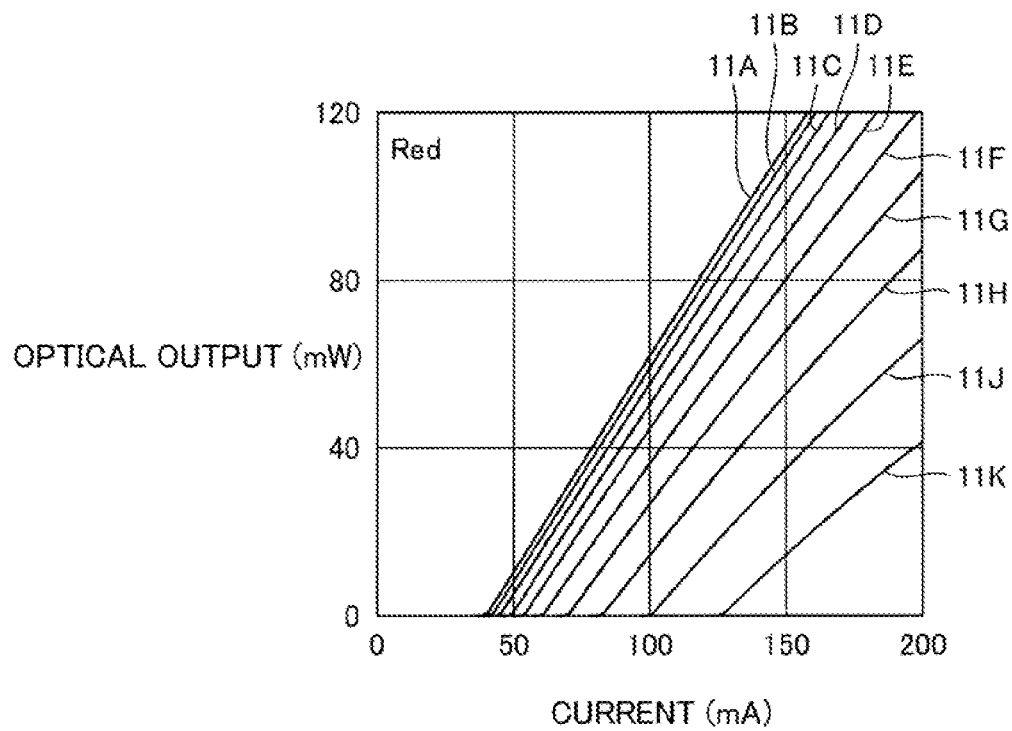
FIG. 5 is a graph showing, for each temperature, a relation between current supplied to a red laser diode and optical output of the red laser diode.

A description will now be given of a relation between current supplied to each of the red laser diode 81, the green laser diode 82, and the blue laser diode 83, which serve as a semiconductor light emitting element, and the resulting optical output. FIG. 5 is a graph showing, for each ambient temperature of the red laser diode 81, a relation between current supplied to the red laser diode 81 and the optical output of the red laser diode 81. In FIG. 5, the vertical axis represents the optical output (in milliwatts (mW)) of the red laser diode 81, and the horizontal axis represents current (in milliamperes (mA)) supplied to the red laser diode 81. In FIG. 5, a line 11A represents the optical output at an ambient temperature of −40° C., a line 11B represents the optical output at an ambient temperature of −20° C., a line 11C represents the optical output at an ambient temperature of 0° C., a line 11D represents the optical output at an ambient temperature of 10° C., a line 11E represents the optical output at an ambient temperature of 20° C., a line 11F represents the optical output at an ambient temperature of 30° C., a line 11G represents the optical output at an ambient temperature of 40° C., a line 11H represents the optical output at an ambient temperature of 50° C., a line 11J represents the optical output at an ambient temperature of 60° C., and a line 11K represents the optical output at an ambient temperature of 70° C.

Figure 6:
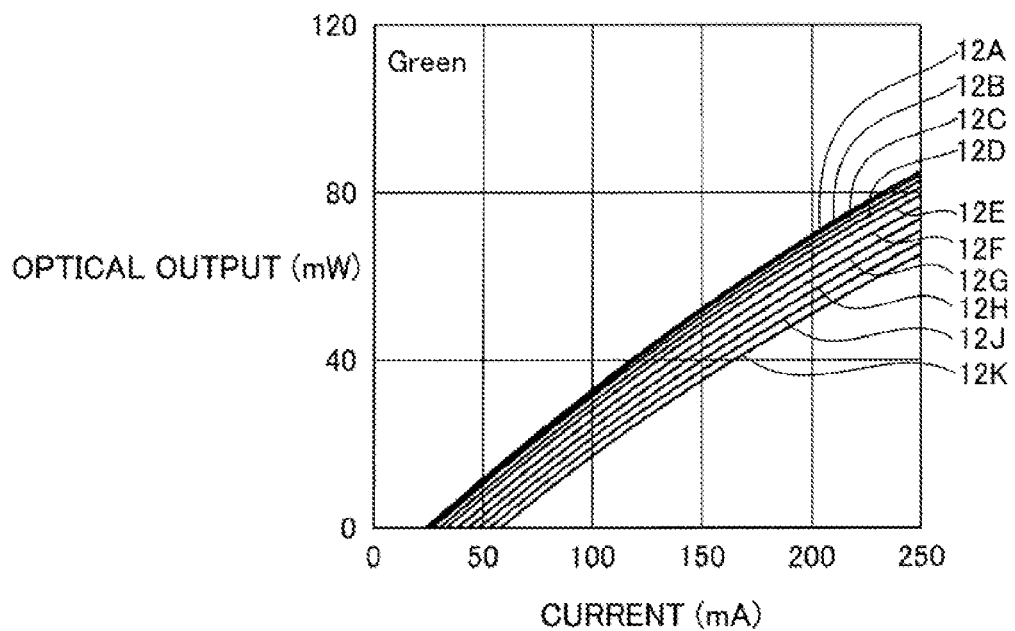
FIG. 6 is a graph showing, for each temperature, a relation between current supplied to a green laser diode and optical output of the green laser diode.

FIG. 6 is a graph showing, for each ambient temperature of the green laser diode 82, a relation between current supplied to the green laser diode 82 and the optical output of the green laser diode 82. In FIG. 6, the vertical axis represents the optical output (mW) of the green laser diode 82, and the horizontal axis represents current (mA) supplied to the green laser diode 82. In FIG. 6, a line 12A represents the optical output at an ambient temperature of −40° C., a line 12B represents the optical output at an ambient temperature of −20° C., a line 12C represents the optical output at an ambient temperature of 0° C., a line 12D represents the optical output at an ambient temperature of 10° C., a line 12E represents the optical output at an ambient temperature of 20° C., a line 12F represents the optical output at an ambient temperature of 30° C., a line 12G represents the optical output at an ambient temperature of 40° C., a line 12H represents the optical output at an ambient temperature of 50° C., a line 12J represents the optical output at an ambient temperature of 60° C., and a line 12K represents the optical output at an ambient temperature of 70° C.

Figure 7:
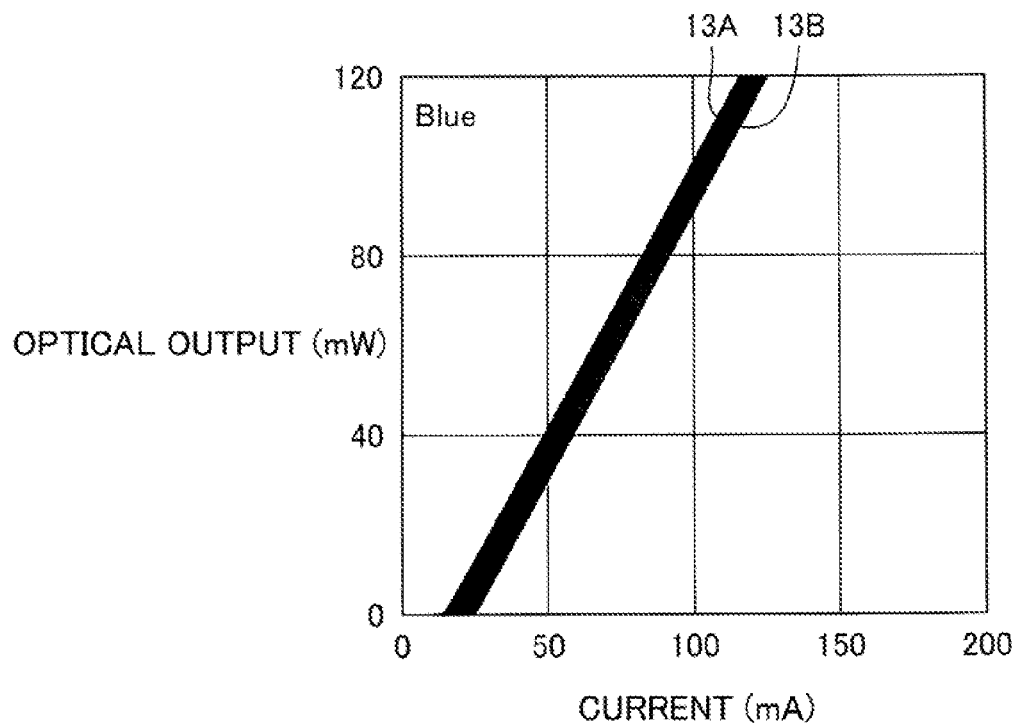
FIG. 7 is a graph showing, for each temperature, a relation between current supplied to a blue laser diode and optical output of the blue laser diode.

FIG. 7 is a graph showing, for each ambient temperature of the blue laser diode 83, a relation between current supplied to the blue laser diode 83 and the optical output of the blue laser diode 83. In FIG. 7, the vertical axis represents the optical output (mW) of the blue laser diode 83, and the horizontal axis represents current (mA) supplied to the blue laser diode 83. In FIG. 7, a line 13A represents the optical output at an ambient temperature of −40° C., and a line 13B represents the optical output at an ambient temperature of 70° C. In the graph of FIG. 7, as in FIGS. 5 and 6, the optical output at an ambient temperature of −20° C., the optical output at an ambient temperature of 0° C., the optical output at an ambient temperature of 10° C., the optical output at an ambient temperature of 20° C., the optical output at an ambient temperature of 30° C., the optical output at an ambient temperature of 40° C., the optical output at an ambient temperature of 50° C., and the optical output at an ambient temperature of 60° C. are all represented by respective lines. Since the lines overlap one another, however, reference numerals assigned thereto are omitted for ease of understanding. Of the overlapping lines, the line representing the optical output at an ambient temperature of −20° C. is closest to the line 13A, and the other lines representing the optical outputs at an ambient temperature of 0° C., at an ambient temperature of 10° C., at an ambient temperature of 20° C., at an ambient temperature of 30° C., at an ambient temperature of 40° C., at an ambient temperature of 50° C., and at an ambient temperature of 60° C. are presented in this order, with the line representing the optical output at an ambient temperature of 60° C. being closest to the line 13B.

FIGS. 5 to 7 indicate that although there are some differences among the colors, the current required to obtain the same optical output increases with increasing temperature in each color. For example, in FIG. 5, obtaining an optical output of 90 mW requires a current supply of 140 mA at an ambient temperature of 10° C., but requires a current supply of 180 mA at an ambient temperature of 40° C. The amount of heat generation of the laser diode also increases with increasing temperature. This tendency is particularly pronounced in the case of the red laser diode 81. For example, when the optical module 1 is mounted on a car, it is necessary to stably reproduce colors with high accuracy over a wide operating temperature range from about −40° C. to about 105° C. This means that the temperature of the light forming unit 20, including the red laser diode 81, the green laser diode 82, and the blue laser diode 83, needs to be controlled by the TEC 30.

Figure 8:
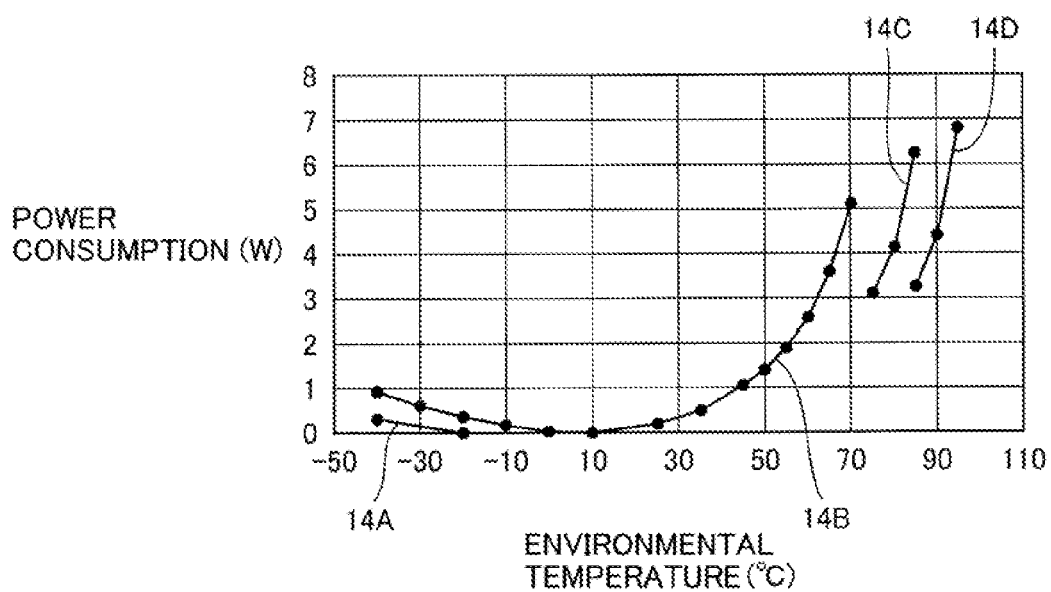
FIG. 8 is a graph showing, for each temperature of a light forming unit, a relation between environmental temperature and power consumption of an electronic cooling module.

A description will now be given of a relation between the environmental temperature, which is the temperature of environment where the light forming unit 20 is placed, and the power consumption of the TEC 30. FIG. 8 is a graph showing, for each temperature of the light forming unit 20, a relation between the environmental temperature and the power consumption of the TEC 30. The temperature of the light forming unit 20 is detected by the thermistor 43 and output as temperature information of the red laser diode 81, the green laser diode 82, and the blue laser diode 83. The temperature of the light forming unit 20 detected by the thermistor 43 is a temperature to which the temperatures of the red laser diode 81, the green laser diode 82, and the blue laser diode 83 are set. That is, the TEC 30 is operated such that the temperatures of the red laser diode 81, the green laser diode 82, and the blue laser diode 83 are equal to the temperature detected by the thermistor 43, and the resulting power consumption of the TEC 30 is plotted in FIG. 8. Note, however, that the temperature on the light forming unit 20 has a distribution, and that the temperature detected by the thermistor 43 does not exactly agree with the respective temperatures of the red laser diode 81, the green laser diode 82, and the blue laser diode 83. In FIG. 8, the vertical axis represents the power consumption (W) of the TEC 30, and the horizontal axis represents the environmental temperature (° C.). The environmental temperature is the temperature of environment where the light forming unit 20 is placed. The environmental temperature is detected by the thermocouple 42, and is output as temperature information of the environmental temperature. A line 14A represents power consumed when the temperature of the light forming unit 20 is 10° C., a line 14B represents power consumed when the temperature of the light forming unit 20 is 35° C., a line 14C represents power consumed when the temperature of the light forming unit 20 is 50° C., and a line 14D represents power consumed when the temperature of the light forming unit 20 is 60° C.

FIG. 8 shows, for example, that when the temperature of the light forming unit 20 is 35° C. and the environmental temperature is 70°, the power consumption of the TEC 30 is as high as over 5 W, which is very high. That is, a large temperature difference between the temperature of the light forming unit 20 and the environmental temperature means high power consumption of the TEC 30. As the power consumption of the TEC 30 increases, the amount of heat generation of the TEC 30 increases. The same applies to the cases where the temperature of the light forming unit 20 is 50° C. and 60° C. When the amount of heat generation of the TEC 30 increases, the fan 104 may need to be frequently operated. This leads to a further increase in power consumption and, moreover, makes it difficult to reduce the size of the heat sink 102. To reduce the power consumption of the TEC 30 and reduce the amount of heat generation of the TEC 30, it is necessary to reduce the temperature difference between the environmental temperature and the light forming unit 20.

A method for controlling the optical module 1 according to the present embodiment will now be described. The method for controlling the optical module 1 includes a step of detecting, using the thermistor 43, the temperature of the light forming unit 20 serving as a light emitting unit including a semiconductor light emitting element, and outputting temperature information of the red laser diode 81, the green laser diode 82, and the blue laser diode 83 serving as the semiconductor light emitting element; a step of detecting an environmental temperature and outputting temperature information of the environmental temperature, the environmental temperature being the temperature of environment where the light forming unit 20 is placed; and a step of controlling the output of the TEC 30 on the basis of the temperature information of the red laser diode 81, the green laser diode 82, and the blue laser diode 83 and the temperature information of the environmental temperature, and adjusting the temperature of the light forming unit 20.

Figure 9:
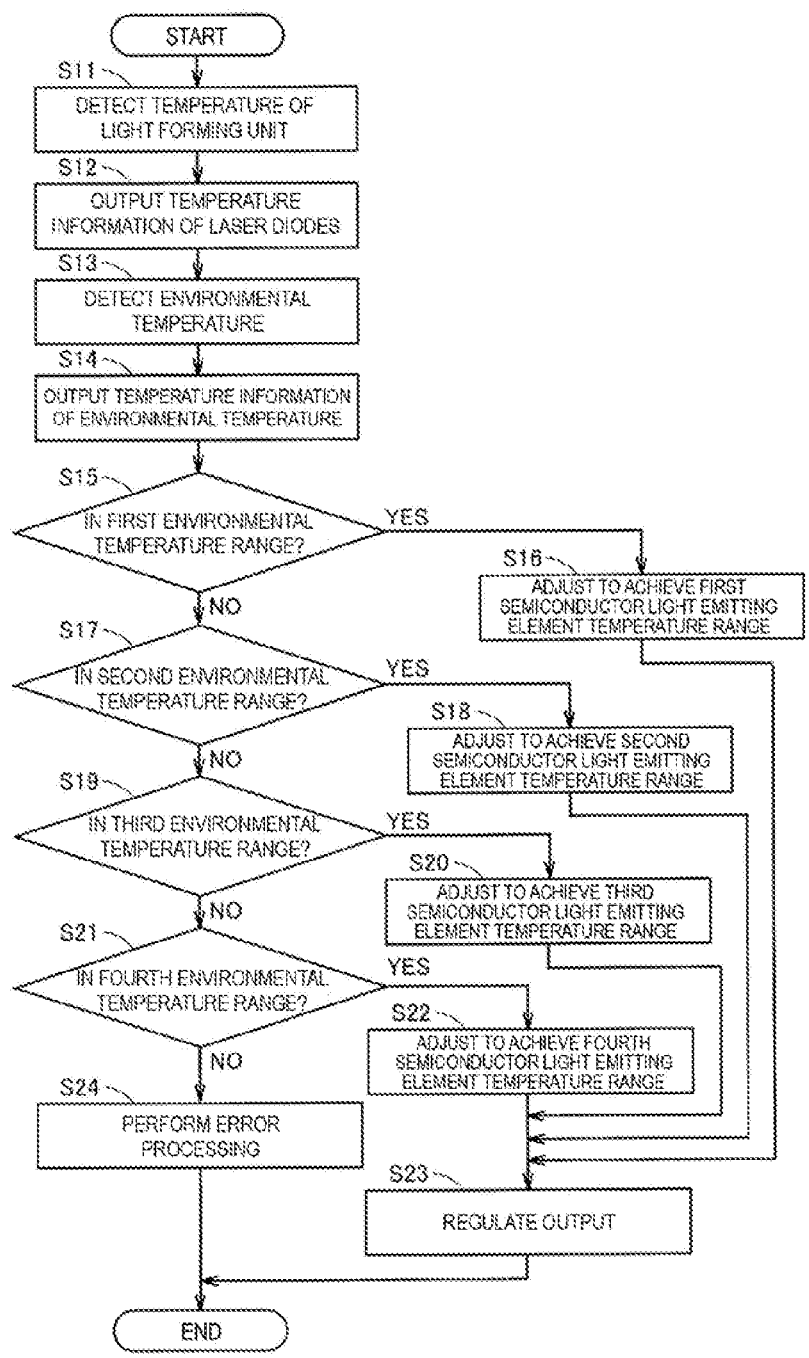
FIG. 9 is a flowchart illustrating major steps in an optical module control method according to an embodiment of the present invention.

FIG. 9 is a flowchart illustrating major steps in the method for controlling the optical module 1 according to an embodiment of the present invention. Referring to FIG. 9, first, the temperature of the light forming unit 20, which serves as a light emitting unit and includes the red laser diode 81, the green laser diode 82, and the blue laser diode 83, is detected (step S11 in FIG. 9; hereinafter "step" will be omitted). The thermistor 43 detects the temperature of the light forming unit 20 here. Next, temperature information of the red laser diode 81, the green laser diode 82, and the blue laser diode 83 is output from the detected temperature (S12). This temperature information is the same as the temperature detected by the thermistor 43. The process from START to this step corresponds to the step of outputting temperature information of the red laser diode 81, the green laser diode 82, and the blue laser diode 83.

Then, an environmental temperature, which is the temperature of environment where the light forming unit 20 is placed, is detected (S13). The environmental temperature is detected by the thermocouple 42 here. Next, temperature information of the environmental temperature is output from the environmental temperature detected by the thermocouple 42 (S14). This temperature information is the same as the temperature detected by the thermocouple 42. The process from completion of the step of outputting the temperature information of the red laser diode 81, the green laser diode 82, and the blue laser diode 83 to this step corresponds to the step of outputting temperature information of the environmental temperature.

Then, the output of the TEC 30 is controlled on the basis of the temperature information of the red laser diode 81, the green laser diode 82, and the blue laser diode 83 and the temperature information of the environmental temperature, and the process proceeds to the step of adjusting the temperature of the light forming unit 20. This step is a temperature adjusting step.

Figure 10:
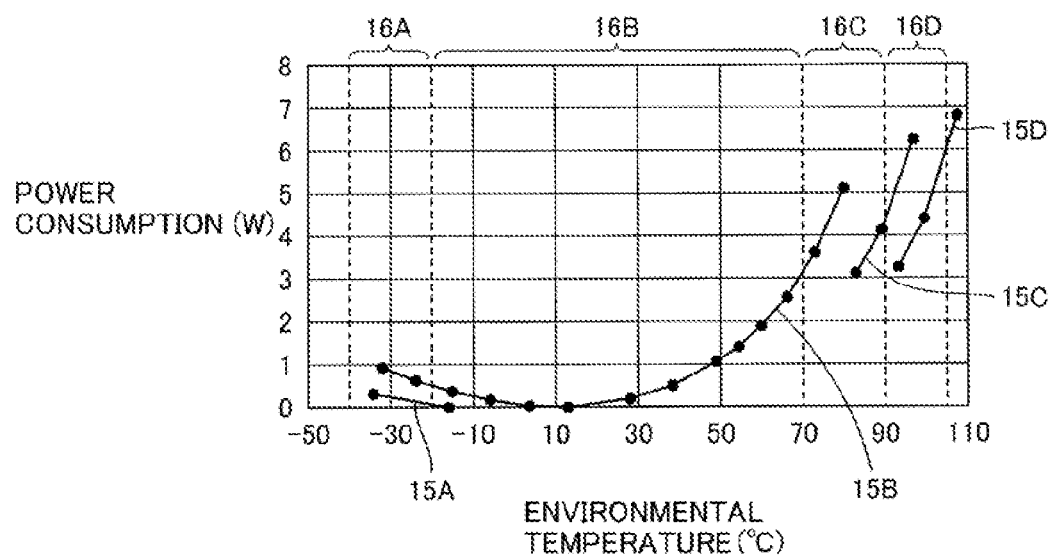
FIG. 10 is a graph showing, for each temperature of the light forming unit, a relation between environmental temperature and power consumption of the electronic cooling module.

FIG. 10 is a graph showing, for each temperature of the light forming unit 20, a relation between environmental temperature and the power consumption of the TEC 30. In FIG. 10, the vertical axis represents the power consumption (W) of the TEC 30, and the horizontal axis represents the environmental temperature (° C.). A line 15A represents power consumed when the temperature of the light forming unit 20 is 10° C., a line 15B represents power consumed when the temperature of the light forming unit 20 is 35° C., a line 15C represents power consumed when the temperature of the light forming unit 20 is 50° C., and a line 15D represents power consumed when the temperature of the light forming unit 20 is 60° C. Drive conditions of the optical module 1 under which the data shown in the graph of FIG. 10 is acquired are as follows. That is, a continuous wave (CW or non-modulated continuous wave) is supplied as current, and the optical output of the red laser diode 81 is 90 mW, the optical output of the green laser diode 82 is 60 mW, and the optical output of the blue laser diode 83 is 50 mW. The environmental temperature is a temperature detected by the thermocouple 42 attached to the cap 40.

Referring to FIG. 10, if the environmental temperature is in a first environmental temperature range 16A of −40° C. or higher and lower than −20° C. shown in FIG. 10 (YES in S15), the temperature adjusting step adjusts the temperature of the light forming unit 20 such that the temperature range of the red laser diode 81, the green laser diode 82, and the blue laser diode 83 is a first semiconductor light emitting element temperature range (S16). The first semiconductor light emitting element temperature range in this case is set to 10° C. That is, the temperature of the light forming unit 20 is adjusted such that the temperature range of the red laser diode 81, the green laser diode 82, and the blue laser diode 83 is 10° C.

If the environmental temperature is outside the first environmental temperature range 16A (NO in S15) and the environmental temperature is in a second environmental temperature range 16B of −20° C. or higher and lower than 70° C. (YES in S17), which is higher than the first environmental temperature range 16A, the temperature adjusting step adjusts the temperature of the light forming unit 20 such that the temperature range of the red laser diode 81, the green laser diode 82, and the blue laser diode 83 is a second semiconductor light emitting element temperature range higher than the first semiconductor light emitting element temperature range (S18). The second semiconductor light emitting element temperature range in this case is set to 35° C. That is, the temperature of the light forming unit 20 is adjusted such that the temperature range of the red laser diode 81, the green laser diode 82, and the blue laser diode 83 is 35° C.

In this embodiment, the temperature adjusting step involves more stages to adjust the temperature of the light forming unit 20. Specifically, the temperature adjusting step involves a total of four stages, as described below, to adjust the temperature of the light forming unit 20.

If the environmental temperature is outside the second environmental temperature range 16B (NO in S17) and the environmental temperature is in a third environmental temperature range 16C of 70° C. or higher and lower than 90° C. (YES in S19), which is higher than the second environmental temperature range 16B, the temperature adjusting step adjusts the temperature of the light forming unit 20 such that the temperature range of the red laser diode 81, the green laser diode 82, and the blue laser diode 83 is a third semiconductor light emitting element temperature range higher than the second semiconductor light emitting element temperature range (S20). The third semiconductor light emitting element temperature range in this case is set to 50° C. That is, the temperature of the light forming unit 20 is adjusted such that the temperature range of the red laser diode 81, the green laser diode 82, and the blue laser diode 83 is 50° C.

If the environmental temperature is outside the third environmental temperature range 16C (NO in S19) and the environmental temperature is in a fourth environmental temperature range 16D of 90° C. or higher and 105° C. or lower (YES in S21), which is higher than the third environmental temperature range 16C, the temperature adjusting step adjusts the temperature of the light forming unit 20 such that the temperature range of the red laser diode 81, the green laser diode 82, and the blue laser diode 83 is a fourth semiconductor light emitting element temperature range higher than the third semiconductor light emitting element temperature range (S22). The fourth semiconductor light emitting element temperature range in this case is set to 60° C. That is, the temperature of the light forming unit 20 is adjusted such that the temperature range of the red laser diode 81, the green laser diode 82, and the blue laser diode 83 is 60° C.

The temperature adjusting step thus carries out control to adjusts the temperature of the light forming unit 20. This makes power consumption of the TEC 30 less than 5 W, over a wide temperature range from the first environmental temperature range 16A to the fourth environmental temperature range 16D.

Then, by controlling current supplied to the red laser diode 81, the green laser diode 82, and the blue laser diode 83 in accordance with the temperature range of the red laser diode 81, the green laser diode 82, and the blue laser diode 83 adjusted in the step of adjusting the temperature of the light forming unit 20, the output of the red laser diode 81, the green laser diode 82, and the blue laser diode 83 is regulated (S23). Specifically, the optical output of the red laser diode 81, the green laser diode 82, and the blue laser diode 83 is made constant by driving an automatic power control (APC) circuit (not shown) to vary the current.

Figure 11:
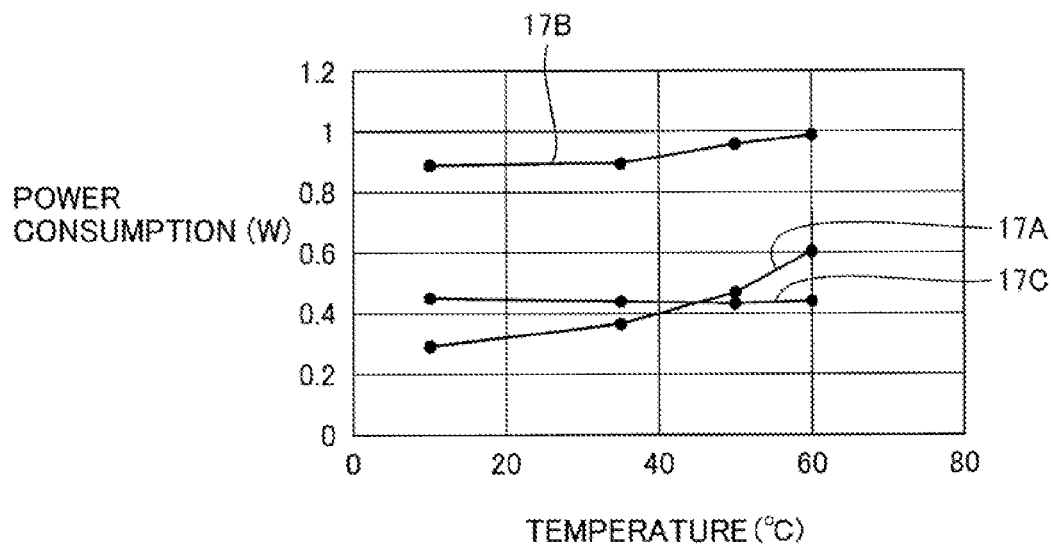
FIG. 11 is a graph showing a relation between temperature and power consumption of each of red green, and blue laser diodes.

A description will now be given of a relation between power consumption and temperature of each of the red laser diode 81, the green laser diode 82, and the blue laser diode 83 whose output has been adjusted. FIG. 11 is a graph showing a relation between power consumption and temperature of each of the red laser diode 81, the green laser diode 82, and the blue laser diode 83. The vertical axis represents the power consumption (W) of each laser diode and the horizontal axis represents the temperature (° C.) detected by the thermistor 43. The temperature detected by the thermistor 43 is the temperature of the light forming unit 20, that is, the temperature of each of the red laser diode 81, the green laser diode 82, and the blue laser diode 83. Referring to FIG. 11, the power consumption of the red laser diode 81, represented by a line 17A, increases to a certain level as the temperature of the light forming unit 20 rises. However, the increase is very small relative to a reduction in the power consumption of the TEC 30 achieved by the method for controlling the optical module 1. The power consumption of the green laser diode 82, represented by a line 17B, slightly increases as the temperature of the light forming unit 20 rises, but the level of increase is lower than that in the red laser diode 81. The power consumption of the blue laser diode 83, represented by a line 17C, changes very little with increasing temperature of the light forming unit 20. The total power consumption of the red laser diode 81, the green laser diode 82, and the blue laser diode 83 can be made less than 2 W.

Therefore, even when the semiconductor light emitting element temperature range is raised and the total power consumption of the red laser diode 81, the green laser diode 82, and the blue laser diode 83 slightly increases, the power consumption of the TEC 30 can be significantly reduced and the total power consumption can be reduced. Specifically, the total power consumption can be made less than 10 W and the size of the heat sink 102 can be reduced.

If the environmental temperature is outside the fourth environmental temperature range 16D in S21 of FIG. 9 (NO in S21), the environmental temperature is not in the −40° C. to 105° C. range. In this case, for example, error processing is performed (S24).

As described above, the method for controlling the optical module 1 according to the aforementioned embodiment of the invention of the present application can reduce power consumption while reducing the system size.

The optical module 1 described above has the following configuration. That is, the optical module 1 includes the light forming unit 20 including the base plate 60 serving as a base member and the red laser diode 81, the green laser diode 82, and the blue laser diode 83 mounted on the base plate 60 and serving as a semiconductor light emitting element, the light forming unit 20 being configured to form light and serving as a light emitting unit; the cap 40 and the stem 10, the cap 40 having the exit window 41 allowing light from the light forming unit 20 to pass therethrough, the cap 40 being configured to surround the light forming unit 20 and serving as a protective member; the TEC 30 configured to adjust the temperatures of the red laser diode 81, the green laser diode 82, and the blue laser diode 83; the thermistor 43 configured to detect the temperature of the light forming unit 20 and serving as a light emitting unit temperature detector; and the thermocouple 42 configured to detect the temperature of environment where the light forming unit 20 is placed, the thermocouple 42 serving as an environmental temperature detector.

In the optical module 1 described above, the TEC 30 can adjust the temperature of the red laser diode 81, the green laser diode 82, and the blue laser diode 83. Also, the thermistor 43 can detect the temperature of the light forming unit 20, and the thermocouple 42 can detect the temperature of environment where the light forming unit 20 is placed. By using the detected temperature of the light forming unit 20 and the detected temperature of the environment where the light forming unit 20 is placed, that is, by using the detected temperature of the light emitting unit and the detected temperature of the environment where the light emitting unit is placed, the reduction of system size and the reduction of power consumption can be properly achieved.

Specifically, temperature information of the red laser diode 81, the green laser diode 82, and the blue laser diode 83 is output from the temperature of the light forming unit 20 detected by the thermistor 43, temperature information is output from the environmental temperature of the light forming unit 20 detected by the thermocouple 42, and the output of the TEC 30 is controlled on the basis of the output temperature information of the red laser diode 81, the green laser diode 82, and the blue laser diode 83 and the output temperature information of the environmental temperature. In controlling the output of the TEC 30, if the environmental temperature is in a first environmental temperature range, the temperature of the light forming unit 20 is adjusted such that the temperature range of the red laser diode 81, the green laser diode 82, and the blue laser diode 83 is a first semiconductor light emitting element temperature range, and if the environmental temperature is in a second environmental temperature range higher than the first environmental temperature range, the temperature of the light forming unit 20 is adjusted such that the temperature range of the red laser diode 81, the green laser diode 82, and the blue laser diode 83 is the second semiconductor light emitting element temperature range higher than the first semiconductor light emitting element temperature range. This can reduce power consumption of the TEC 30 during temperature adjustment. Again, the control may be carried out by dividing the environmental temperature range into four sections.

In the optical module 1 described above, the thermocouple 42 is attached to the outer periphery of the cap 40. This enables accurate detection of the temperature of environmental where the light forming unit 20 is placed, and enables proper reduction of power consumption.

Although the control is carried out by dividing the environmental temperature range into four sections in the embodiment described above, the configuration is not limited to this. The control may be carried out by dividing the environmental temperature range into three sections, or by dividing the environmental temperature range into two sections. When the environmental temperature range is divided into two sections, for example, a first environmental temperature range may be a range obtained by combining the first environmental temperature range 16A and the second environmental temperature range 16B, or more specifically, a range of −40° C. or higher and lower than 70° C., and a second environmental temperature range may be a range obtained by combining the third environmental temperature range 16C and the fourth environmental temperature range 16D, or more specifically, a range of 70° C. or higher and 105° C. or less. The control described above may be carried out by dividing the environmental temperature range into five or more sections. This enables more precise temperature control and efficient reduction of power consumption.

Although, for example, the first semiconductor light emitting element temperature range is set to a range of 10° C. in the embodiment described above, the temperature range is not limited to this. For example, the control may be carried out over a wider temperature range of 5° C. to 15° C.

In the embodiment described above, the first semiconductor light emitting element temperature range and the second semiconductor light emitting element temperature range may each be within ±3° C. of a central value. That is, for example, the second semiconductor light emitting element temperature range, described above, is a temperature range of 32° C. or higher and 38° C. or lower, with 35° C. being the central value. This enables more proper control.

Also, in the embodiment described above, the order in which to perform the step of detecting the temperature of the light forming unit 20 including the red laser diode 81, the green laser diode 82, and the blue laser diode 83 and outputting the temperature information of the red laser diode 81, the green laser diode 82, and the blue laser diode 83, and the step of detecting the environmental temperature which is the temperature of environment where the light forming unit 20 is placed and outputting the temperature information of the environmental temperature, is not particularly limited. These steps may be performed in reverse order or may be performed simultaneously. For highly accurate control, these steps may be performed at as short an interval as possible.

In the embodiment described above, the control may be performed in the optical module 1 including only the red laser diode 81. The control may be performed in the optical module 1 including only the green laser diode 82, or in the optical module 1 including only the blue laser diode 83. The same is applicable to the optical module 1 including an infrared laser diode.

Although the temperature detected by the thermocouple 42 is defined as the environmental temperature in the embodiment described above, the temperature of the heat sink 102 may be defined as the environmental temperature, or the ambient temperature of the optical module 1 and the heat dissipating system 101 may be defined as the environmental temperature. The position at which the thermocouple 42 is attached is not limited to the outer periphery 40A having the exit window 41. For example, the thermocouple 42 may be attached to a surface of the cap 40 normal to the outer periphery 40A having the exit window 41.

Although the semiconductor light emitting element is a semiconductor laser in the embodiment described above, the semiconductor light emitting element is not limited to this and may be, for example, a light emitting diode.

Figure 12:
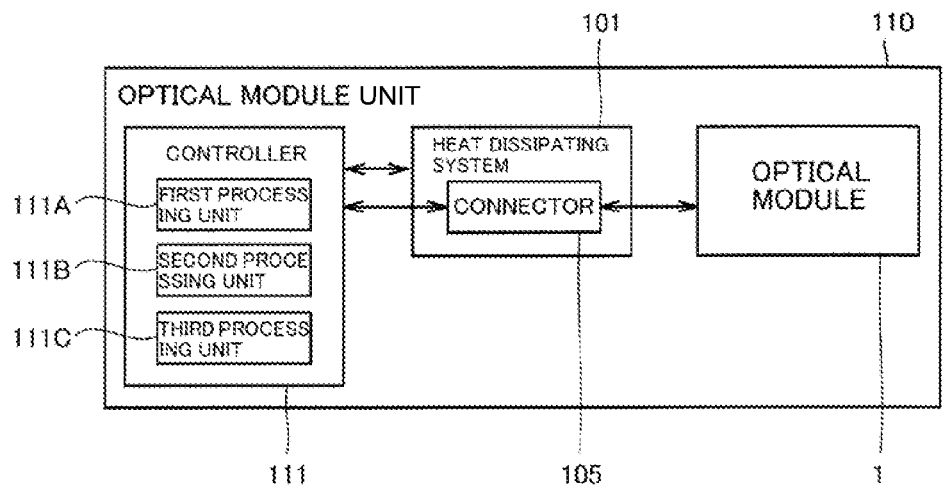
FIG. 12 is a block diagram illustrating an example of an optical module unit.

An optical module unit which implements the method for controlling the optical module 1 according to the embodiment described above may be configured, for example, as follows. FIG. 12 is a block diagram illustrating an example of the optical module unit which implements the method for controlling the optical module 1. Referring to FIG. 12, an optical module unit 110 includes a controller 111 serving as a processing unit, the optical module 1, and the heat dissipating system 101 described above. The controller 111 is formed, for example, by a central processing unit (CPU) and includes a main memory (not shown) serving as a storage unit that temporarily stores data. The controller 111 controls overall operation of the optical module unit 110. The controller 111 controls the heat dissipating system 101. For example, the controller 111 controls the operation of the fan 104. The controller 111 is electrically connected to the optical module 1 through the connector 105 included in the heat dissipating system 101. The controller 111 implements processing in the method for controlling the optical module 1. Specifically, the controller 111 includes a first processing unit 111A configured to detect the temperature of the light emitting unit including the semiconductor light emitting element, and process temperature information of the semiconductor light emitting element in such a manner that the temperature information is output; a second processing unit 111B configured to detect an environmental temperature which is the temperature of environment where the light emitting unit is placed, and process temperature information of the environmental temperature in such a manner that the temperature information is output; and a third processing unit 111C configured to control the output of the electronic cooling module on the basis of the temperature information of the semiconductor light emitting element processed by the first processing unit 111A in such a manner as to be output and the temperature information of the environmental temperature processed by the second processing unit 111B in such a manner as to be output, and adjust the temperature of the light emitting unit. If the environmental temperature is in a first environmental temperature range, the third processing unit 111C, which is configured to adjust the temperature of the light emitting unit, adjusts the temperature of the light emitting unit such that the temperature range of the semiconductor light emitting element is a first semiconductor light emitting element temperature range, and if the environmental temperature is in a second environmental temperature range higher than the first environmental temperature range, the third processing unit 111C adjusts the temperature of the light emitting unit such that the temperature range of the semiconductor light emitting element is a second environmental temperature range higher than the first semiconductor light emitting element temperature range. In this case, the first processing unit 111A may be configured to detect, at predetermined timing using the thermistor 43 included in the optical module 1, the temperature of the light forming unit 20 serving as the light emitting unit and including the red laser diode 81, the green laser diode 82, and the blue laser diode 83 serving as the semiconductor light emitting element, and process temperature information of the red laser diode 81, the green laser diode 82, and the blue laser diode 83 in such a manner that the temperature information is output. Also, the second processing unit 111B may be configured to detect, at predetermined timing using the thermocouple 42 included in the optical module 1, the environmental temperature, which is the temperature of environment where the light forming unit 20 serving as the light emitting unit is placed, and process temperature information of the environmental temperature in such a manner that the temperature information is output.

Figure 13:
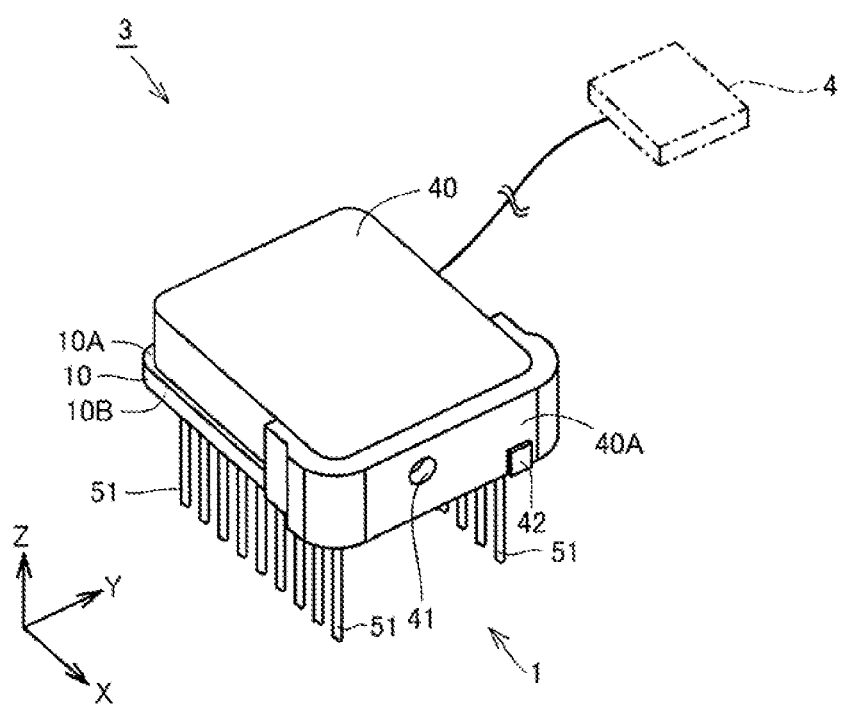
FIG. 13 is a schematic perspective view illustrating a structure of an optical module unit.
Figure 14:
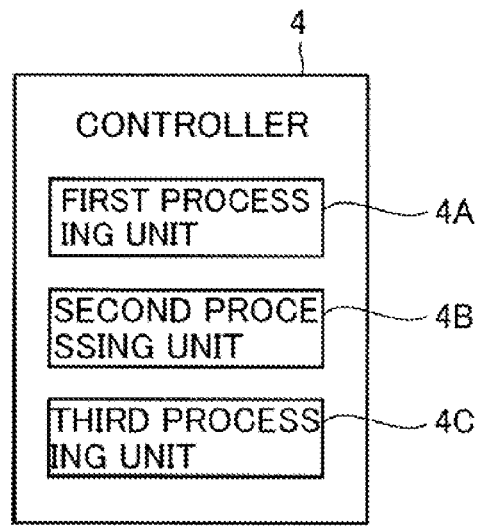
FIG. 14 is a block diagram illustrating a configuration of a controller.

The optical module unit may have the following configuration that does not include the heat dissipating system 101 and others described above. FIG. 13 is a schematic perspective view illustrating a configuration of an optical module unit 3 according to another embodiment of the present invention. FIG. 14 is a block diagram illustrating a configuration of a controller included in the optical module unit 3 illustrated in FIG. 13.

Referring to FIGS. 13 and 14, the optical module unit 3 according to this embodiment of the present invention includes the optical module 1 configured as described above, and a controller 4 configured to control the optical module 1. The optical module 1 includes the light forming unit 20 and the TEC 30. The light forming unit 20 serves as a light emitting unit configured to form light, and includes the base plate 60 serving as a base member and the red laser diode 81, the green laser diode 82, and the blue laser diode 83 mounted on the base plate 60 and serving as a semiconductor light emitting element. The TEC 30 adjusts the temperatures of the red laser diode 81, the green laser diode 82, and the blue laser diode 83. In FIG. 13, the controller 4 is indicated by a dot-and-dash line. The controller 4 includes a first processing unit 4A configured to detect the temperature of the light forming unit 20, and process temperature information of the red laser diode 81, the green laser diode 82, and the blue laser diode 83 in such a manner that the temperature information is output; a second processing unit 4B configured to detect an environmental temperature which is the temperature of environment where the light forming unit 20 is placed, and output temperature information of the environmental temperature; and a third processing unit 4C configured to control the output of the TEC 30 on the basis of the temperature information of the red laser diode 81, the green laser diode 82, and the blue laser diode 83 output by the first processing unit 4A and the temperature information of the environmental temperature output by the second processing unit 4B, and adjust the temperature of the light forming unit 20. If the environmental temperature is in a first environmental temperature range, the third processing unit 4C adjusts the temperature of the light forming unit 20 such that the temperature range of the red laser diode 81, the green laser diode 82, and the blue laser diode 83 is a first semiconductor light emitting element temperature range, and if the environmental temperature is in a second environmental temperature range higher than the first environmental temperature range, the third processing unit 4C adjusts the temperature of the light forming unit 20 such that the temperature range of the red laser diode 81, the green laser diode 82, and the blue laser diode 83 is a second semiconductor light emitting element temperature range higher than the first semiconductor light emitting element temperature range. The optical module unit 3 configured as described above can also reduce power consumption while reducing system size.

Figure 15:
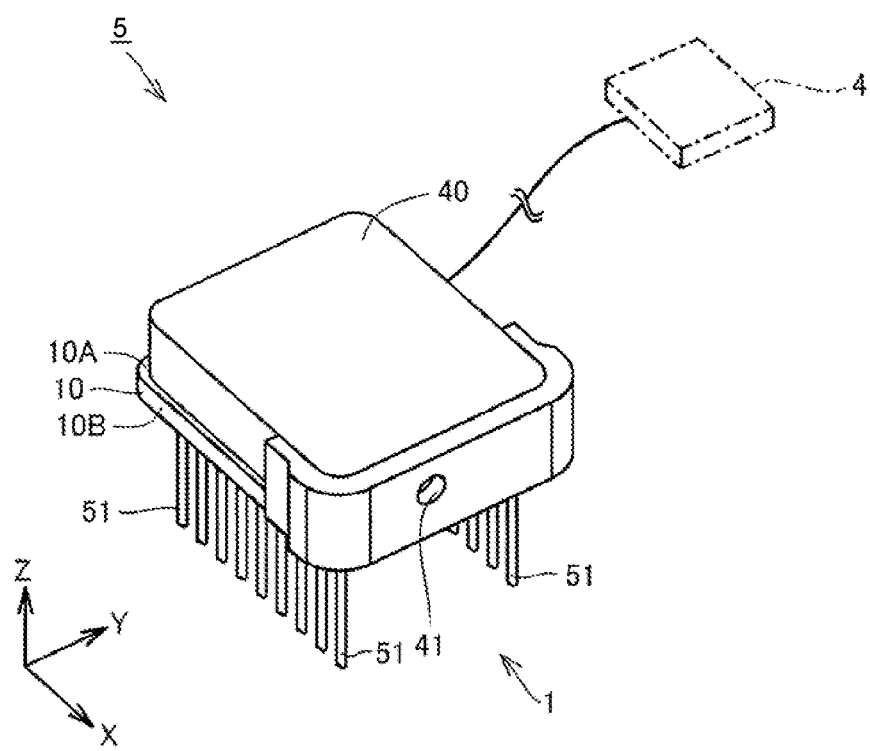
FIG. 15 is a schematic perspective view illustrating a structure of another optical module unit.

An optical module unit according to yet another embodiment of the present invention may have the following configuration. That is, referring to FIG. 15, the optical module 1 included in an optical module unit 5 is configured without the thermocouple 42, but is otherwise configured similarly to that illustrated in FIG. 1. In this case, when detecting an environmental temperature which is the temperature of environment where the light forming unit 20 is placed and outputting temperature information of the environmental temperature, the second processing unit 4B detects the ambient temperature of the optical module 1 as the environmental temperature and outputs the temperature information of the environmental temperature. This configuration can also reduce power consumption while reducing system size.

Figure 16:
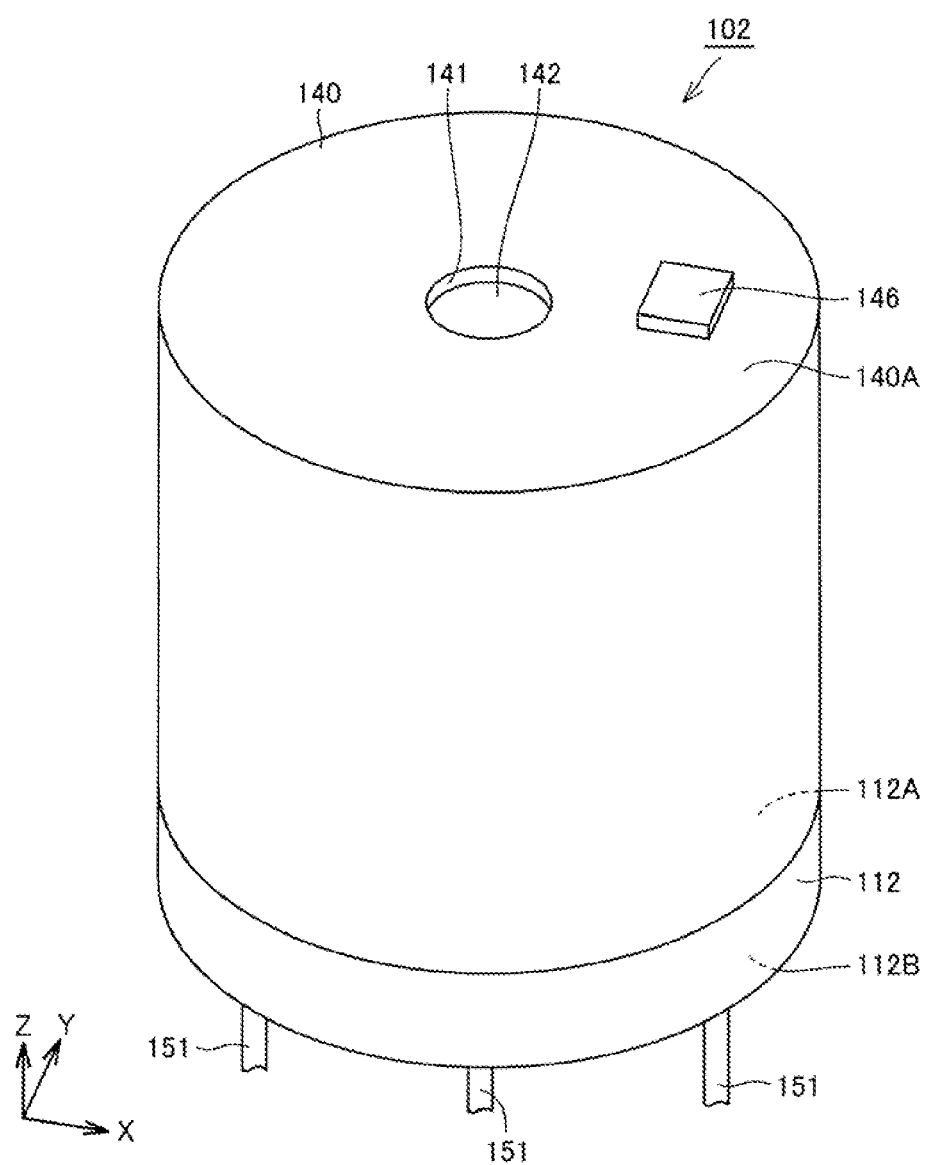
FIG. 16 is a schematic perspective view illustrating a structure of an optical module.
Figure 17:
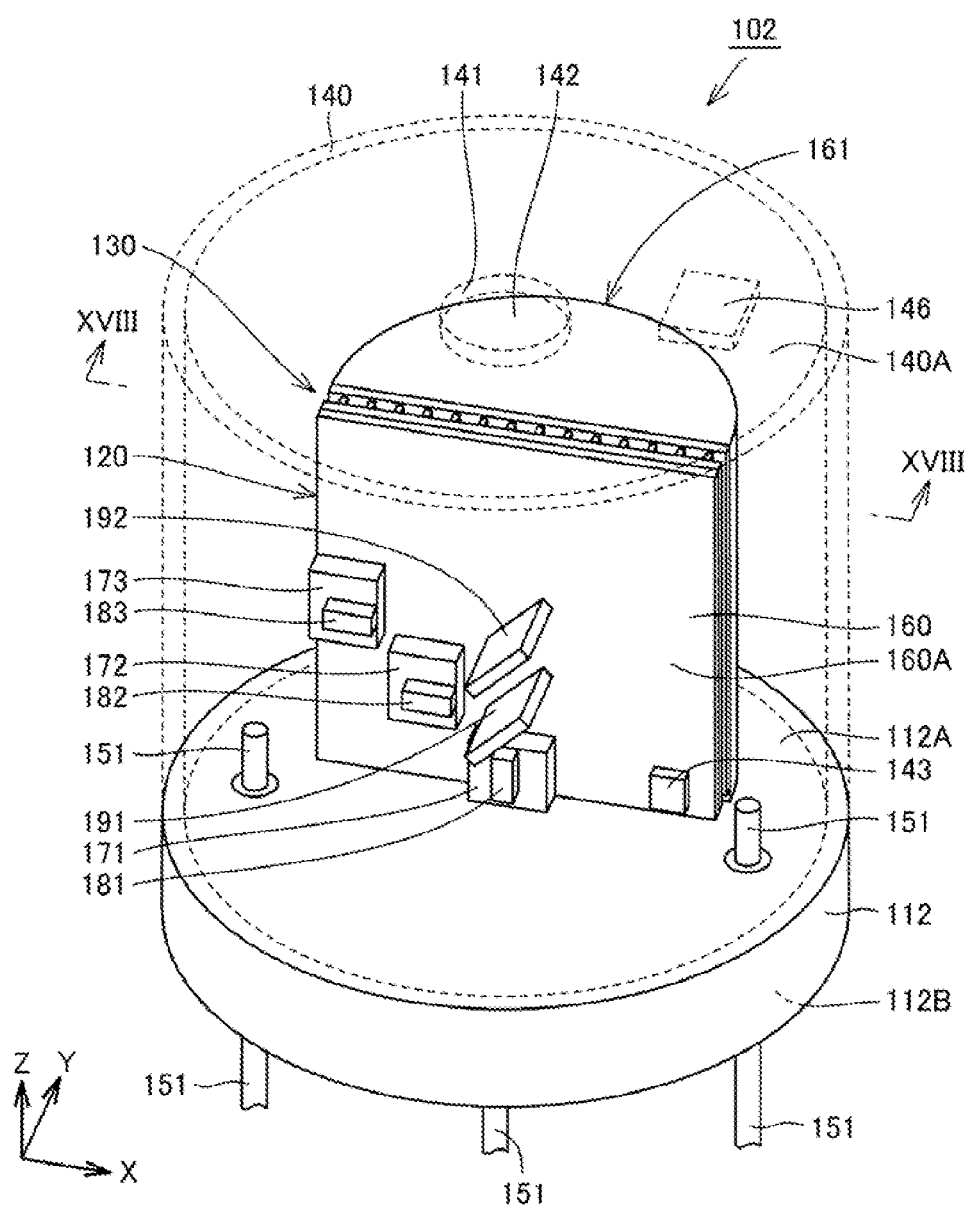
FIG. 17 is another schematic perspective view illustrating the structure of the optical module.
Figure 18:
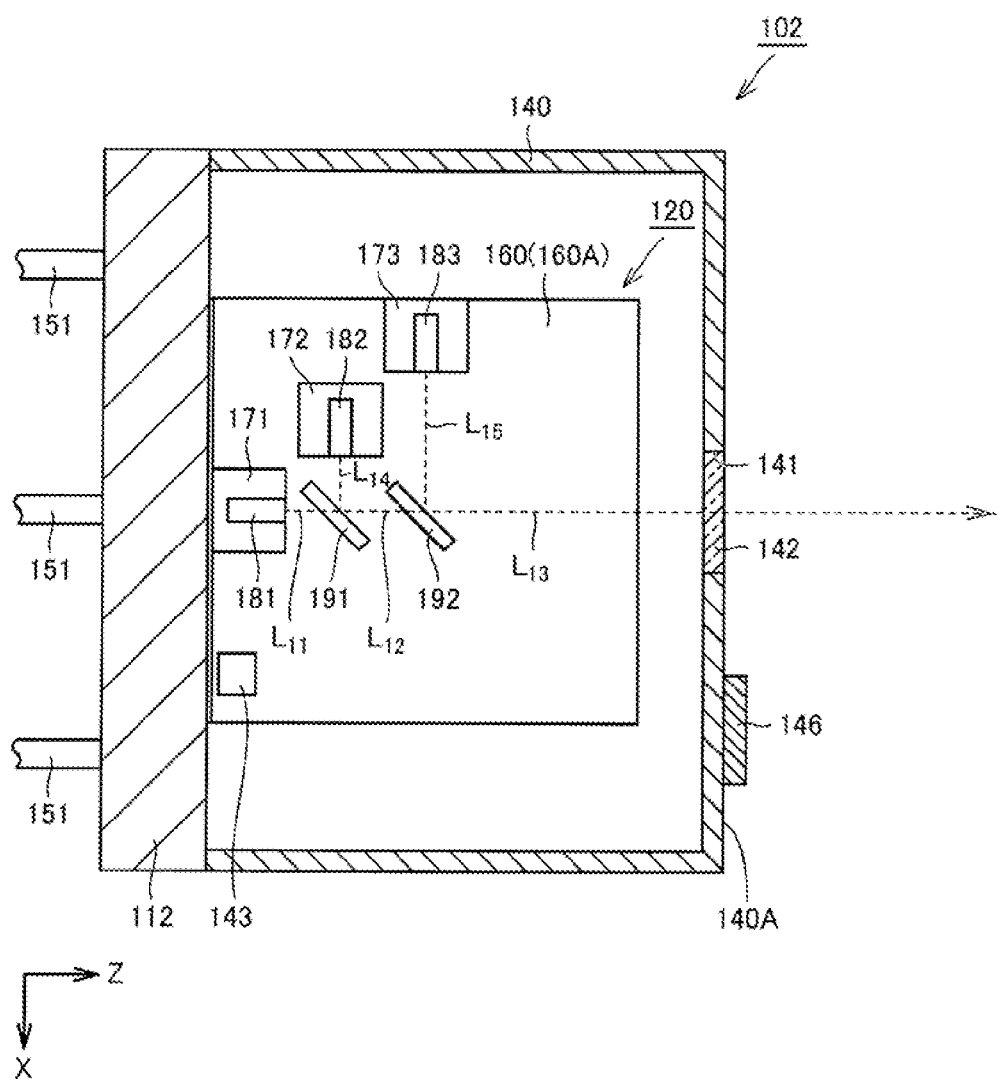
FIG. 18 is a schematic plan view illustrating the structure of the optical module.

The configuration of the optical module described above is also applicable to that configured as described below. FIGS. 16, 17, and 18 illustrate a configuration of an optical module controlled by an optical module control method according to another embodiment of the present invention. FIG. 17 is a view of FIG. 16, with a cap 140 removed. FIG. 18 is a cross-sectional view taken along line XVIII-XVIII in FIG. 17.

Referring to FIGS. 16 to 18, an optical module 100 according to the present embodiment includes a stem 112 having a disk shape; a light forming unit 120 disposed on one principal surface 112A of the stem 112 and serving as a light emitting unit configured to form light; and a plurality of lead pins 151 disposed on the one principal surface 112A of the stem 112 in contact therewith to cover the light forming unit 20 and protruding on both sides of the one principal surface 112A and the other principal surface 112B of the stem 112. The stem 112 and the cap 140 are welded together by such a technique as yttrium aluminium garnet (YAG) laser welding or resistance welding, in an airtight manner. That is, the light forming unit 120 is hermetically sealed by the stem 112 and the cap 140.

A moisture-reduced (or moisture-removed) gas, such as dry air or dry nitrogen, is sealed in the space surrounded by the stem 112 and the cap 140. The cap 140 has an exit window 141 which is a through-hole that allows light from the light forming unit 120 to pass therethrough. The exit window 141 is provided with a transmissive plate 142 having the shape of a flat plate (or disk) with principal surfaces parallel to each other and configured to allow light formed by the light forming unit 120 to pass therethrough. The transmissive plate 142 is made of, for example, glass. The stem 112 and the cap 140 form a protective member.

The cap 140 has a resin-molded thermocouple 146 for detecting the temperature of the cap 140. The thermocouple 146 is attached to the surface of the cap 40 having the exit window 141. That is, the thermocouple 146 is attached to an outer periphery 140A of the cap 140. With the thermocouple 146, the ambient temperature of the light forming unit 120 can be detected as an environmental temperature, and output as temperature information of the environmental temperature. The ambient temperature of the light forming unit 120 is also the ambient temperature of the optical module 100.

Referring to FIG. 17, the light forming unit 120 includes a base plate 160 having a rectangular plate-like shape and serving as the base member, and a base block 161 having a semicircular columnar shape and also serving as the base member. A TEC 130 serving as the electronic cooling module is disposed between the base plate 160 and the base block 161. The TEC 130 has the same configuration as the TEC 30 illustrated in FIG. 2. The base block 161 is secured at the semicircular bottom surface thereof to the one principal surface 112A of the stem 112. The base plate 160 is attached to the base block 161, with the TEC 130 interposed therebetween. The TEC 130 is thus disposed between the base plate 160 and the base block 161. The one principal surface 112A of the stem 112 and each of the base plate 160 and the TEC 130 are provided with a small gap therebetween. This is to prevent the base plate 160 and the TEC 130 from coming into contact with the one principal surface 112A of the stem 112. A mount surface 160A is disposed to intersect the one principal surface 112A of the stem 112, or more specifically, disposed perpendicularly to the one principal surface 112A. The one principal surface 112A and the other principal surface 112B of the stem 112 are along the X-Y plane. The mount surface 160A is along the X-Z plane.

A first submount 171 having a flat plate-like shape is disposed on the mount surface 160A. A red laser diode 181 is disposed on the first submount 171. The red laser diode 181 emits red light. The first submount 171 and the red laser diode 181 are positioned to allow light from the red laser diode 181 to travel along one side (first side) of the mount surface 160A.

A second submount 172 having a flat plate-like shape is disposed on the mount surface 160A. A green laser diode 182 is disposed on the second submount 172. The green laser diode 182 emits green light. The second submount 172 and the green laser diode 182 are positioned to allow light from the green laser diode 182 to travel along another side (second side) of the mount surface 160A intersecting the first side described above. The second submount 172 and the green laser diode 182 are positioned to allow light from the green laser diode 182 to travel in a direction intersecting (orthogonal to) the light from the red laser diode 181.

A third submount 173 having a flat plate-like shape is disposed on the mount surface 160A. A blue laser diode 183 is disposed on the third submount 173. The blue laser diode 183 emits blue light. The third submount 173 and the blue laser diode 183 are positioned to allow light from the blue laser diode 183 to travel along the second side of the mount surface 160A. The third submount 173 and the blue laser diode 183 are positioned to allow light from the blue laser diode 183 to travel in a direction intersecting (orthogonal to) the light from the red laser diode 181. The third submount 173 and the blue laser diode 183 are positioned to allow light from the blue laser diode 183 to travel in a direction along the light from the green laser diode 182 (i.e., in a direction parallel to the light from the green laser diode 182).

The heights of the optical axes of the red laser diode 181, the green laser diode 182, and the blue laser diode 183 (i.e., the distances between the mount surface 160A (reference surface) and the optical axes, or the distances with respect to the reference surface in the Y-axis direction) are adjusted to the same level by the first submount 171, the second submount 172, and the third submount 173. The red laser diode 181 emits light in the Z-direction. The green laser diode 182 and the blue laser diode 183 emit light in the X-direction. The light emitting direction of the red laser diode 181 intersects the light emitting directions of the green laser diode 182 and the blue laser diode 183. More specifically, the light emitting direction of the red laser diode 181 is orthogonal to the light emitting directions of the green laser diode 182 and the blue laser diode 183. A principal surface of the third submount 173 on which the blue laser diode 183 is mounted, a principal surface of the second submount 172 on which the green laser diode 182 is mounted, and a principal surface of the first submount 171 on which the red laser diode 181 is mounted, are parallel to each other.

A thermistor 143 is disposed on the mount surface 160A. The thermistor 143 is disposed on a side of the mount surface 160A adjacent to the one principal surface 120A of the stem 112, and positioned to avoid the first submount 171, the second submount 172, the third submount, and a first filter 191 and a second filter 192 described below. The thermistor 143 detects the temperature of the light forming unit 120 including the red laser diode 181, the green laser diode 182, and the blue laser diode 183, and outputs temperature information of the light forming unit 120.

The first filter 191 is disposed in a region of the mount surface 160A corresponding to a position at which the light emitted from the red laser diode 181 intersects the light emitted from the green laser diode 182. The second filter 192 is disposed in a region of the mount surface 160A corresponding to a position at which the light emitted from the red laser diode 181 intersects the light emitted from the blue laser diode 183. The first filter 191 and the second filter 192 both have the shape of a flat plate with principal surfaces parallel to each other. The first filter 191 and the second filter 192 are, for example, wavelength-selective filters. The first filter 191 and the second filter 192 are dielectric multilayer filters.

The first filter 191 transmits red light and reflects green light. The second filter 192 transmits red light and green light, and reflects blue light. The first filter 191 and the second filter 192 thus selectively transmit and reflect light of a specific wavelength. The first filter 191 and the second filter 192 thus combine light beams emitted from the red laser diode 181, the green laser diode 182, and the blue laser diode 183.

The principal surfaces of the first filter 191 and the second filter 192 tilt with respect to the Z-direction and the X-direction. More specifically, the principal surfaces of the first filter 191 and the second filter 192 tilt 45° from the Z-direction (i.e., the light emitting direction of the red laser diode 181) and the X-direction (i.e., the light emitting direction of the green laser diode 182 and the blue laser diode 183).

Light emitted from the red laser diode 181 reaches the first filter 191 and the second filter 192 without passing through any lens. Light emitted from the green laser diode 182 reaches the first filter 191 and the second filter 192 without passing through any lens. Light emitted from the blue laser diode 183 reaches the second filter 192 without passing through any lens. That is, no lens is placed between the red laser diode 181 and the first filter 191, no lens is placed between the green laser diode 182 and the first filter 191, and no lens is placed between the blue laser diode 183 and the second filter 192. Light from each of the red laser diode 181, the green laser diode 182, and the blue laser diode 183 reaches the exit window 141 without passing through any lens.

The operation of the optical module 100 according to the present embodiment will now be described. Referring to FIG. 18, red light emitted from the red laser diode 181 travels along an optical path $L_{11}$ and enters the first filter 191. Since the first filter 191 transmits red light, the light emitted from the red laser diode 181 travels further along an optical path Liz and enters the second filter 192. Since the second filter 192 transmits red light, the light emitted from the red laser diode 181 travels further along an optical path $L_{13}$, passes through the transmissive plate 142 disposed in the exit window 141 of the cap 140, and exits the optical module 100.

Green light emitted from the green laser diode 182 travels along an optical path $L_{14}$ and enters the first filter 191. Since the first filter 191 reflects green light, the light emitted from the green laser diode 182 joins the optical path $L_{12}$. The green light thus coaxially combines with the red light, travels along the optical path $L_{12}$, and enters the second filter 192. Since the second filter 192 transmits green light, the light emitted from the green laser diode 182 travels further along the optical path $L_{13}$, passes through the transmissive plate 142 disposed in the exit window 141 of the cap 140, and exits the optical module 100.

Blue light emitted from the blue laser diode 183 travels along an optical path $L_{15}$ and enters the second filter 192. Since the second filter 192 reflects blue light, the light emitted from the blue laser diode 183 joins the optical path $L_{13}$. The blue light thus combines with the red light and the green light, travels along the optical path $L_{13}$, passes through the transmissive plate 142 disposed in the exit window 141 of the cap 140, and exits the optical module 100.

Thus, light formed by combining the red, green, and blue light is emitted through the exit window 141 of the cap 140. The light emitted from the red laser diode 181, the green laser diode 182, and the blue laser diode 183 is divergent light. Light reaching the first filter 191 without passing through any lens and light reaching the second filter 192 without passing through any lens are coaxially combined by the first filter 191 and the second filter 192. That is, beams of divergent light from the red laser diode 181, the green laser diode 182, and the blue laser diode 183 are directly received and coaxially combined by the first filter 191 and the second filter 192.

The first filter 191 and the second filter 192 are adjusted in position and orientation using, for example, a reference lens and a charge coupled device (CCD) camera, such that beams of light from the red laser diode 181, the green laser diode 182, and the blue laser diode 183 coincide with a predetermined reference point. This is followed by attaching the cap 140 to the stem 112.

The configuration described above is also employed for the method for controlling the optical module 100 with this configuration. That is, the method for controlling the optical module 100 includes a step of detecting the temperature of the light forming unit 120 serving as a light emitting unit and including the red laser diode 181, the green laser diode 182, and the blue laser diode 183 serving as a semiconductor light emitting element, and outputting temperature information of the red laser diode 181, the green laser diode 182, and the blue laser diode 183; a step of detecting an environmental temperature, which is the temperature of environment where the light forming unit 120 is placed, and outputting temperature information of the environmental temperature; and a step of controlling the output of the TEC 130 on the basis of the temperature information of the red laser diode 181, the green laser diode 182, and the blue laser diode 183 and the temperature information of the environmental temperature, and adjusting the temperature of the light forming unit 120. In the step of adjusting the temperature of the light forming unit 120, if the environmental temperature is in a first environmental temperature range, the temperature of the light forming unit 120 is adjusted such that the temperature range of the red laser diode 181, the green laser diode 182, and the blue laser diode 183 is a first semiconductor light emitting element temperature range, and if the environmental temperature is in a second environmental temperature range higher than the first environmental temperature range, the temperature of the light forming unit 120 is adjusted such that the temperature range of the red laser diode 181, the green laser diode 182, and the blue laser diode 183 is a second semiconductor light emitting element temperature range higher than the first semiconductor light emitting element temperature range. This optical module control method can also reduce power consumption while reducing system size. Again, as described above, the control may be carried out by dividing the environmental temperature range into four sections.

Figure 19:
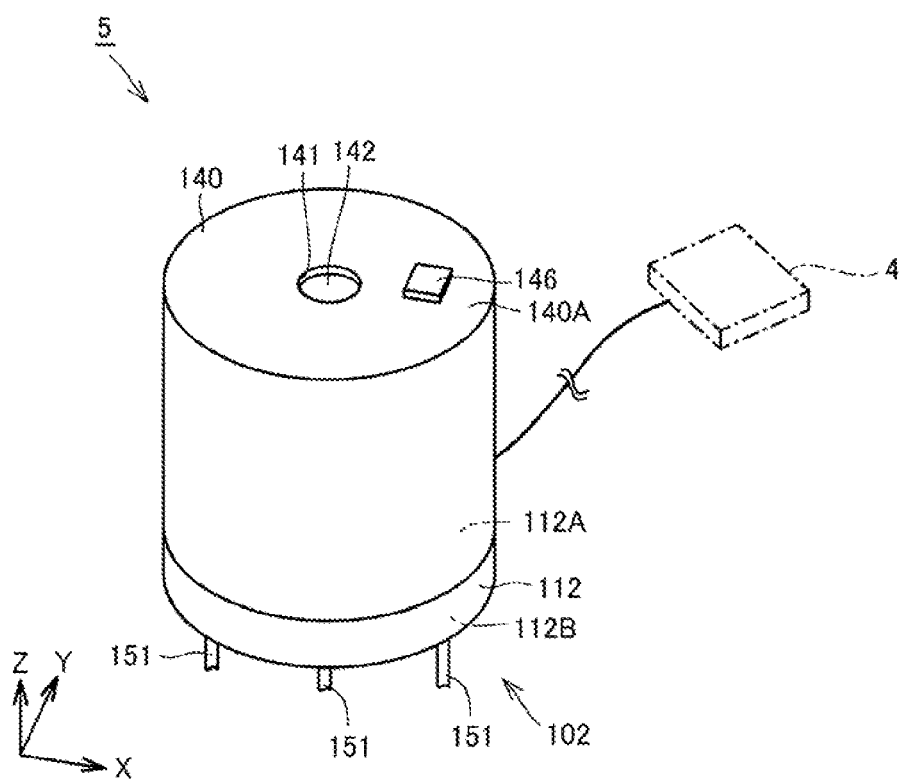
FIG. 19 is a schematic perspective view illustrating a structure of an optical module unit.

An optical module unit including the optical module 100 configured as described above is as follows. That is, as illustrated in FIG. 19, the optical module unit 5 includes the optical module 100 configured as described above, and the controller 4 configured to control the optical module 100. The optical module 100 includes the light forming unit 120 and the TEC 130. The light forming unit 120 serves as a light emitting unit configured to form light, and includes the base plate 160 and the base block 161 serving as a base member, and the red laser diode 181, the green laser diode 182, and the blue laser diode 183 mounted on the base plate 160 and serving as a semiconductor light emitting element. The TEC 130 adjusts the temperatures of the red laser diode 181, the green laser diode 182, and the blue laser diode 183. The controller 4 includes the first processing unit 4A configured to detect the temperature of the light forming unit 120, and process temperature information of the red laser diode 181, the green laser diode 182, and the blue laser diode 183 in such a manner that the temperature information is output; the second processing unit 4B configured to detect an environmental temperature which is the temperature of environment where the light forming unit 120 is placed, and output temperature information of the environmental temperature; and the third processing unit 4C configured to control the output of the TEC 130 on the basis of the temperature information of the red laser diode 181, the green laser diode 182, and the blue laser diode 183 output by the first processing unit 4A and the temperature information of the environmental temperature output by the second processing unit 4B, and adjust the temperature of the light forming unit 120. If the environmental temperature is in a first environmental temperature range, the third processing unit 4C adjusts the temperature of the light forming unit 120 such that the temperature range of the red laser diode 181, the green laser diode 182, and the blue laser diode 183 is a first semiconductor light emitting element temperature range, and if the environmental temperature is in a second environmental temperature range higher than the first environmental temperature range, the third processing unit 4C adjusts the temperature of the light forming unit 120 such that the temperature range of the red laser diode 181, the green laser diode 182, and the blue laser diode 183 is a second semiconductor light emitting element temperature range higher than the first semiconductor light emitting element temperature range. The optical module unit 5 with this configuration can also reduce power consumption while reducing system size.

It is to be understood that the embodiments and examples disclosed herein are illustrative, not restrictive, in all aspects. The scope of the present invention is defined by the appended claims, not by the explanation described above. All changes made within the appended claims and meanings and scopes equivalent thereto are intended to be embraced by the present invention.

REFERENCE SIGNS LIST

1, 102: optical module, 3, 5, 110: optical module unit, 4, 111: controller, 4A, 111A: first processing unit, 4B, 111B: second processing unit, 4C, 111C: third processing unit, 10, 112: stem, 10A, 112A: one principal surface, 10B, 112B: the other principal surface, 11A, 11B, 11C, 11D, 11E, 11F, 11G, 11H, 11J, 11K, 12A, 12B, 12C, 12D, 12E, 12F, 12G, 12H, 12J, 12K, 13A, 13B, 14A, 14B, 14C, 14D, 15A, 15B, 15C, 15D, 17A, 17B, 17C: line, 16A: first environmental temperature range, 16B: second environmental temperature range, 16C: third environmental temperature range, 16D: fourth environmental temperature range, 20, 120: light forming unit, 30, 130: electronic cooling module (or thermoelectric cooler (TEC)), 31: heat absorbing plate, 32: heat dissipating plate, 33: semiconductor column, 40, 140: cap, 41, 141: exit window, 42, 146: thermocouple, 43, 143: thermistor, 44: thermistor mount region, 51, 151: lead pin, 60, 160: base plate, 60A, 160A: one principal surface, 60B, 160B: the other principal surface, 61: base region, 62: chip mount region, 63: first chip mount region, 64: second chip mount region, 71, 171: first submount, 72, 172: second submount, 73, 173: third submount, 74: fourth submount, 75: fifth submount, 76: sixth submount, 77: first lens holder, 78: second lens holder, 79: third lens holder, 81, 181: red laser diode, 82, 182: green laser diode, 83, 183: blue laser diode, 88: first raised region, 89: second raised region, 91: first lens, 92: second lens, 93: third lens, 91A, 92A, 93A: lens portion, 94: first photodiode, 95: second photodiode, 96: third photodiode, 94A, 95A, 96A: light receiving portion, 97, 191: first filter, 98, 192: second filter, 101: heat dissipating system, 102: heat sink, 103: retainer plate, 103A: first guide portion, 103B: second guide portion, 103C: third guide portion, 104: fan, 105: connector, 106: base member, 106A: one principal surface, 106B: the other principal surface, 107: fin, 108A, 108B, 108C, 108D: screw hole, 109A, 109B, 109C, 109D: screw, 142: transmissive plate, 161: base block

The invention claimed is:

1. An optical module control method for controlling an optical module that includes a semiconductor light emitting element and an electronic cooling module configured to adjust a temperature of the semiconductor light emitting element, the method comprising:
    a step of detecting a temperature of a light emitting unit including the semiconductor light emitting element, and outputting temperature information of the semiconductor light emitting element;
    a step of detecting an environmental temperature and outputting temperature information of the environmental temperature, the environmental temperature being a temperature of environment where the light emitting unit is placed; and
    a step of controlling an output of the electronic cooling module on the basis of the temperature information of the semiconductor light emitting element and the temperature information of the environmental temperature, and adjusting the temperature of the light emitting unit,
    wherein in the step of adjusting the temperature of the light emitting unit, if the environmental temperature is in a first environmental temperature range, the temperature of the light emitting unit is adjusted such that a temperature range of the semiconductor light emitting element is a first semiconductor light emitting element temperature range, and if the environmental temperature is in a second environmental temperature range higher than the first environmental temperature range, the temperature of the light emitting unit is adjusted such that the temperature range of the semiconductor light emitting element is a second semiconductor light emitting element temperature range higher than the first semiconductor light emitting element temperature range, and
    wherein the first semiconductor light emitting element temperature range and the second semiconductor light emitting element temperature range each are within ±3° C. of a central value.

2. The optical module control method according to claim 1, wherein the semiconductor light emitting element is a semiconductor laser.

3. The optical module control method according to claim 2, wherein the semiconductor laser is a laser that emits red light or a laser that emits infrared light.

4. The optical module control method according to claim 1, further comprising a step of regulating an output of the semiconductor light emitting element by controlling current supplied to the semiconductor light emitting element in accordance with the temperature range of the semiconductor light emitting element adjusted in the step of adjusting the temperature of the light emitting unit.

5. An optical module unit comprising:
    an optical module including a light emitting unit and an electronic cooling module, the light emitting unit including a base member and a semiconductor light emitting element mounted on the base member, the light emitting unit being configured to form light, the electronic cooling module being configured to adjust a temperature of the semiconductor light emitting element;
    a first processing unit configured to detect a temperature of the light emitting unit including the semiconductor light emitting element, and process temperature information of the semiconductor light emitting element in such a manner that the temperature information is output;
    a second processing unit configured to detect an environmental temperature which is a temperature of environment where the light emitting unit is placed, and process temperature information of the environmental temperature in such a manner that the temperature information is output; and a third processing unit configured to control an output of the electronic cooling module on the basis of the temperature information of the semiconductor light emitting element processed by the first processing unit in such a manner as to be output and the temperature information of the environmental temperature processed by the second processing unit in such a manner as to be output, and adjust the temperature of the light emitting unit, wherein if the environmental temperature is in a first environmental temperature range, the third processing unit adjusts the temperature of the light emitting unit such that a temperature range of the semiconductor light emitting element is a first semiconductor light emitting element temperature range, and if the environmental temperature is in a second environmental temperature range higher than the first environmental temperature range, the third processing unit adjusts the temperature of the light emitting unit such that the temperature range of the semiconductor light emitting element is a second semiconductor light emitting element temperature range higher than the first semiconductor light emitting element temperature range, and wherein the first semiconductor light emitting element temperature range and the second semiconductor light emitting element temperature range each are within ±3° C. of a central value.

6. The optical module unit according to claim 5, wherein the optical module further includes a protective member configured to surround the light emitting unit, and an environmental temperature detector attached to an outer periphery of the protective member and configured to detect the environmental temperature which is a temperature of environment where the light emitting unit is placed.

7. An optical module comprising:
a light emitting unit including a base member and a semiconductor light emitting element mounted on the base member, the light emitting unit being configured to form light;

a protective member having an exit window that allows light from the light emitting unit to pass therethrough, the protective member being configured to surround the light emitting unit;

an electronic cooling module configured to adjust a temperature of the semiconductor light emitting element;

a light emitting unit temperature detector configured to detect a temperature of the light emitting unit including the semiconductor light emitting element; and an environmental temperature detector configured to detect a temperature of environment where the light emitting unit is placed, wherein the electronic cooling module adjusts the temperature of the semiconductor light emitting element based on the temperature of the light emitting unit and the temperature of environment, wherein if the environmental temperature is in a first environmental temperature range, the electronic cooling module adjusts the temperature of the semiconductor light emitting element such that a temperature range of the semiconductor light emitting element is a first semiconductor light emitting element temperature range, and if the environmental temperature is in a second environmental temperature range higher than the first environmental temperature range, the electronic cooling module adjusts the temperature of the semiconductor light emitting element such that the temperature range of the semiconductor light emitting element is a second semiconductor light emitting element temperature range higher than the first semiconductor light emitting element temperature range, and wherein the first semiconductor light emitting element temperature range and the second semiconductor light emitting element temperature range each are within ±3° C. of a central value.

8. The optical module according to claim 7, wherein the environmental temperature detector is attached to an outer periphery of the protective member.

* * * * *

UNITED STATES PATENT AND TRADEMARK OFFICE
CERTIFICATE OF CORRECTION

PATENT NO. : 10,886,700 B2  
APPLICATION NO. : 16/467786  
DATED : January 5, 2021  
INVENTOR(S) : Yohei Enya et al.

Page 1 of 1

It is certified that error appears in the above-identified patent and that said Letters Patent is hereby corrected as shown below:

On the Title Page

In Item (71), Applicant name "Sumitomo Electric Insdustries, Ltd." should read -- Sumitomo Electric Industries, Ltd. --.

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*